United States Patent
Kang et al.

(10) Patent No.: US 8,158,480 B2
(45) Date of Patent: Apr. 17, 2012

(54) METHOD OF FORMING A PATTERN FOR A SEMICONDUCTOR DEVICE, METHOD OF FORMING A CHARGE STORAGE PATTERN USING THE SAME METHOD, NON-VOLATILE MEMORY DEVICE AND METHODS OF MANUFACTURING THE SAME

(75) Inventors: Hee-Soo Kang, Yongin-si (KR); Choong-Ho Lee, Yongin-si (KR); Suk-Kang Sung, Seongnam-si (KR); Se-Jun Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 703 days.

(21) Appl. No.: 12/213,305

(22) Filed: Jun. 18, 2008

(65) Prior Publication Data
US 2008/0308860 A1    Dec. 18, 2008

(30) Foreign Application Priority Data

Jun. 18, 2007 (KR) .................. 10-2007-0059283
Mar. 17, 2008 (KR) .................. 10-2008-0024494

(51) Int. Cl.
*H01L 21/336* (2006.01)
(52) U.S. Cl. ................ 438/266; 257/326; 257/E21.192; 257/E21.209
(58) Field of Classification Search .................. 257/326, 257/E21.192, E21.209
See application file for complete search history.

(56) References Cited

U.S. PATENT DOCUMENTS

2007/0264793 A1* 11/2007 Oh et al. ................ 438/427
2009/0206315 A1*  8/2009 Weis et al. ................ 257/4

FOREIGN PATENT DOCUMENTS

| JP | 2005-026592 | 1/2005 |
|---|---|---|
| KR | 1020060133677 | 12/2006 |
| KR | 1020070002293 | 1/2007 |

* cited by examiner

*Primary Examiner* — Matthew Landau
*Assistant Examiner* — Sonya McCall Shepard
(74) *Attorney, Agent, or Firm* — Harness, Dickey & Pierce, P.L.C.

(57) ABSTRACT

A method of forming a semiconductor device pattern, a method of forming a charge storage pattern, a non-volatile memory device including a charge storage pattern and a method of manufacturing the same are provided. The method of forming the charge storage pattern including forming a trench on a substrate, and a device isolation pattern in the trench. The device isolation pattern protrudes from a surface of the substrate such that an opening exposing the substrate is formed. A tunnel oxide layer is formed on the substrate in the opening. A preliminary charge storage pattern is formed on the tunnel oxide layer and the device isolation pattern by selective deposition of conductive materials. The preliminary charge storage pattern may be removed from the device isolation pattern. The preliminary charge storage pattern remains only on the tunnel oxide layer to form the charge storage pattern on the substrate.

10 Claims, 17 Drawing Sheets

CELL AREA    PERIPHERAL AREA

CELL AREA    PERIPHERAL AREA

METHOD OF FORMING A PATTERN FOR A SEMICONDUCTOR DEVICE, METHOD OF FORMING A CHARGE STORAGE PATTERN USING THE SAME METHOD, NON-VOLATILE MEMORY DEVICE AND METHODS OF MANUFACTURING THE SAME

PRIORITY STATEMENT

This application claims priority under 35 U.S.C. §119 to Korean Patent Application No. 2007-59283, filed on Jun. 18, 2007, and Korean Patent Application No. 2008-24494, filed on Mar. 17, 2008, in the Korean Intellectual Property Office (KIPO), the contents of which are herein incorporated by reference in their entirety.

BACKGROUND

1. Field

Example embodiments relate to a method of forming a pattern for a semiconductor device and a method of forming a charge storage pattern using the same. Other example embodiments relate to a non-volatile memory device including a charge storage pattern and methods of manufacturing the same. Other example embodiments relate to a method of forming a pattern having a smaller and/or more uniform thickness.

2. Description of the Related Art

Semiconductor memory devices, in general, are classified as either volatile or non-volatile memory devices. Volatile memory devices (e.g., dynamic random access memory (DRAM) devices and static random access memory (SRAM) devices) may have relatively higher input/output (I/O) speeds and lose data stored therein when power is shut off. Non-volatile memory devices (e.g., read-only memory (ROM) devices) maintain data stored therein even when power is shut off. Among the non-volatile memory devices, electrically erasable programmable ROM (EEPROM) devices or flash memory devices are higher in demand. Particularly, the flash memory device is a kind of an advanced EEPROM device in which data may be erased at a relatively high speed. In the flash memory device, data which is electrically stored may be programmed or erased through a Fowler-Nordheim (F-N) tunneling mechanism and/or a channel hot electron injection mechanism.

Flash memory devices may be classified, in general, as a NAND type and a NOR type. NOR flash memory devices may have higher operation speeds. NAND flash memory devices have a higher degree of integration.

The NAND flash memory device requires that the programming and erasing of the data be performed in a short time at as low a voltage as possible. As such, each unit cell of the NAND flash memory device needs to have a substantially high coupling ratio.

For increasing the coupling ratio of the NAND flash memory device, the electrical capacitance between the floating gate and the control gate needs to be higher and/or the electrical capacitance between the floating gate and the substrate needs to be lower in a unit cell of the NAND flash memory device.

A line width and a gap distance in the gate pattern needs to be smaller in a unit cell of the NAND flash memory device in order to increase the degree of integration of the NAND flash memory device.

A conventional dielectric layer includes a multilayer structure in which a silicon oxide layer, a silicon nitride layer and a silicon oxide layer may be sequentially stacked between the floating gate pattern and the control gate pattern in a flash memory device. It is desirable that the floating gate pattern, which the dielectric layer contacts, has a substantially large surface area so as to increase the capacitance between the floating gate pattern and the control gate pattern. As such, the floating gate pattern may be formed with a substantially. large line width The dielectric layer may be formed even on a sidewall of the floating gate pattern.

If the floating gate pattern has a substantially large thickness and a small gap distance, a parasitic capacitance may rapidly increase between neighboring floating gate patterns causing interference between neighboring unit cells. The neighboring floating gate patterns may be frequently coupled electrically. As such, programming of a first unit cell unintentionally causes programming of a second unit cell adjacent to the first unit cell, which in turn unintentionally increases the threshold voltage of the second unit cell. The unit cells may be spaced apart from each other by a desired distance in order to prevent (or reduce) interference between neighboring unit cells. The large gap space between the unit cells requires a large surface area for the unit cell, decreasing the degree of integration of the NAND flash memory device.

In order to address the above problems, a metal oxide having a higher dielectric constant is used as the dielectric layer. If the dielectric constant of the dielectric layer is substantially high, the dielectric layer may have a larger capacitance although the surface area of the floating gate pattern is decreased. As such, the line width and height of the floating gate pattern may be decreased and the degree of integration of the flash memory device may be increased. The relatively small height of the floating gate pattern reduces the parasitic capacitance between the neighboring floating gate patterns.

As described above, operation characteristics of the NAND flash memory device may increase due to the reduction of the pattern height of the floating gate. It may be difficult to form the floating gate pattern with a smaller height.

Hereinafter, the height of the pattern may be described (or referred to) as a thickness of the pattern for the convenience of understanding, and thus the small height of the pattern means (or includes) a thin pattern and a large height of the pattern means (or includes) a thick pattern.

If the floating gate pattern has a non-uniform thickness, the coupling ratio is different at each pair of the neighboring unit cells. A non-uniform coupling ratio in a flash memory device usually causes an operation failure of the device. As such, it is desirable to have a floating gate pattern with a substantially uniform height for operation reliability. It may be difficult to form a floating gate pattern having a more uniform and thin thickness on the entire surface of a substrate in view of the manufacturing process.

It may be desirable to form gate patterns with a substantially large thickness despite the smaller thickness of the floating gate patterns. For example, the gate patterns of a selection transistor, which is located at a marginal portion of cell transistor chains of a flash memory device, and of a transistor, which is in a peripheral region of a substrate, may have a substantially large thickness even though the floating gate patterns of the other transistors have a substantially small thickness. It may be difficult to form only the floating gate pattern with a substantially small thickness while the gate patterns of the selection transistor and the peripheral transistor are formed with a substantially large thickness.

SUMMARY

Example embodiments relate to a method of forming a pattern for a semiconductor device and a method of forming a charge storage pattern using the same. Other example embodiments relate to a non-volatile memory device including a charge storage pattern and methods of manufacturing the same. Other example embodiments relate to a method of forming a pattern having a smaller and/or more uniform thickness.

According to example embodiments, there is provided a method of forming a pattern for a semiconductor device including forming a mold pattern on a substrate, and selectively forming a preliminary pattern on the mold pattern and on the substrate exposed through the mold pattern. The preliminary pattern may be removed from the mold pattern such that only the preliminary pattern remains on the substrate in order to form the pattern on the substrate.

In example embodiments, the preliminary pattern may be formed by a physical vapor deposition (PVD) process or a chemical vapor deposition (CVD) process. For example, the CVD process may include a high-density plasma CVD (HDP-CVD) process.

In example embodiments, a thickness of the preliminary pattern may be formed less than a protrusion thickness of the mold pattern measured from a surface of the substrate.

According to example embodiments, there is provided a method of forming a charge storage pattern for a non-volatile memory device including partially forming a trench on a substrate by an etching process. A device isolation pattern may be formed in the trench. The device isolation pattern may protrude from a surface of the substrate to form an opening through which the surface of the substrate is exposed. A tunnel oxide layer may be formed on the substrate in the opening. A preliminary charge storage pattern may be formed on the tunnel oxide layer and on the device isolation pattern by selectively depositing a conductive material. The preliminary charge storage pattern may be removed (or etched) from the device isolation pattern such that only the preliminary charge storage pattern remains on the tunnel oxide layer to form the charge storage pattern on the substrate.

In example embodiments, the preliminary charge storage pattern may be formed by a PVD process or a CVD process. For example, the CVD process may include an HDP-CVD process.

In example embodiments, the preliminary charge storage pattern may include at least one material selected from the group consisting of polysilicon doped with impurities, a metal, a metal silicide and compositions thereof. The preliminary charge storage pattern may include at least one of a silicon nitride, a metal oxide and combinations thereof.

In example embodiments, the preliminary charge storage pattern may be formed with a thickness less than a protrusion thickness of the device isolation pattern measured from a surface of the substrate. The preliminary charge storage pattern may be formed with a thickness of about 20 Å to about 500 Å.

In example embodiments, after forming the preliminary charge storage pattern, a protective layer may be formed on the preliminary charge storage pattern and a sidewall of the device isolation pattern.

In example embodiments, a sidewall of the device isolation pattern that defines the opening, through which the substrate is exposed, may be slanted. An upper portion of the opening may be smaller than a lower portion of the opening.

In example embodiments, an upper portion of the device isolation pattern may be removed from the substrate after the opening is formed.

According to example embodiments, there is provided a method of manufacturing a non-volatile memory device including forming a trench partially on a substrate by an etching process. A device isolation pattern may be formed in the trench. The device isolation pattern may protrude from a surface of the substrate, forming an opening through which the surface of the substrate is exposed. A tunnel oxide layer may be formed on the substrate in the opening. A first preliminary charge storage pattern may be formed on the tunnel oxide layer and on the device isolation pattern by selectively depositing a conductive material. A second preliminary charge storage pattern may be formed on the substrate by removing the first preliminary charge storage pattern from the device isolation pattern. A dielectric layer and an electrode layer may be formed on the second preliminary charge storage pattern and the device isolation pattern. The electrode layer, the dielectric layer and the second preliminary charge storage pattern may be sequentially patterned into a charge storage pattern, a dielectric pattern and a control gate pattern formed on the substrate.

In example embodiments, the first preliminary charge storage pattern may be formed by a PVD process or an HDP-CVD process.

In example embodiments, the first preliminary charge storage pattern may include at least one material selected from the group consisting of polysilicon doped with impurities, silicon nitride, a metal oxide and compositions thereof.

According to example embodiments, there is provided a non-volatile memory device including device isolation patterns, cell transistors interposed between the device isolation patterns on the cell area of the substrate, and peripheral transistors interposed between the device isolation patterns on the peripheral area of the substrate. There is provided a substrate on which a cell area and a peripheral area are defined. The device isolation patterns may protrude from a surface of the substrate in a device isolation region. The device isolation region defines an active region on which a conductive structure is formed. Each of the cell transistors includes a tunnel oxide pattern, a charge storage pattern, a dielectric pattern and a control gate pattern that are sequentially stacked on the substrate. Each of the peripheral transistors includes a gate insulation pattern and a gate electrode having a thickness greater than that of the charge storage pattern of each of the cell transistors.

In example embodiments, the gate electrode of each of the peripheral transistors includes a butting structure at an upper portion thereof. A conductive pattern, which is formed of substantially the same material as that of the control gate pattern of each of the cell transistors, may be electrically connected to the gate electrode.

In example embodiments, the non-volatile memory device includes a selection transistor positioned on the cell area of the substrate. The selection transistor may be electrically connected to each of the cell transistors in series. The selection gate includes a second gate insulation pattern, a second gate electrode having a thickness greater than that of the charge storage pattern, and a control gate pattern that is electrically connected to the second gate electrode. The selection transistor may include a butting structure.

In example embodiments, the non-volatile memory device includes a selection transistor positioned on the cell area of the substrate. The selection transistor may be electrically connected to each of the cell transistors in series. The selection gate may be formed of substantially the same material and structure as the cell transistors.

According to example embodiments, there is provided a method of manufacturing a non-volatile memory device including forming device isolation patterns that protrude from a surface of the substrate defined by a cell area and a peripheral area. A peripheral transistor may be formed between the device isolation patterns on the peripheral area of the substrate. The peripheral transistor includes a gate insulation pattern and a gate electrode that are sequentially stacked on the substrate. A cell transistor may be formed between the device isolation patterns on the cell area of the substrate. The cell transistor includes a tunnel oxide pattern, a charge storage pattern having a thickness less than that of the gate electrode of the peripheral transistor, a dielectric pattern and a control gate pattern that may be sequentially stacked on the substrate.

In example embodiments, a mask pattern for the device isolation pattern may be formed on the cell area and the peripheral area of the substrate.

In example embodiments, prior to forming the peripheral transistor, the mask pattern may be removed from the peripheral area of the substrate, to form an opening that partially exposes the peripheral area of the substrate. The processing step for forming the peripheral transistor includes forming a gate insulation layer and a gate electrode on the substrate exposed through the opening.

In example embodiments, prior to forming the cell transistor, the mask pattern may be removed from the cell area of the substrate to form an opening through which the cell area of the substrate is partially exposed.

In example embodiments, the cell transistor may be formed on the substrate by forming a tunnel oxide layer on the cell area of the substrate exposed through the opening, and forming a charge storage layer on the tunnel oxide layer and on the device isolation pattern by a deposition process of a conductive material. A preliminary charge storage pattern may be formed on the cell area of the substrate by etching (or removing) the charge storage layer from the device isolation pattern such that only the charge storage layer remains on the tunnel oxide layer. A dielectric layer and an electrode layer may be formed on the preliminary charge storage pattern. The electrode layer, the dielectric layer and the preliminary charge storage pattern may be sequentially patterned into a charge storage pattern, a dielectric pattern and a control gate pattern on the cell area of the substrate.

In example embodiments, the charge storage layer may be formed by a PVD process or a CVD process. In example embodiments, the CVD process includes an HDP-CVD process.

In example embodiments, the charge storage layer includes a conductive layer for a floating gate electrode or a charge trap layer.

In example embodiments, the charge storage layer may be formed with a thickness of about 10 Å to about 500 Å.

In an example embodiment, a conductive pattern may be formed on the gate electrode of the peripheral transistor. The conductive pattern may be electrically connected to the gate electrode. The conductive pattern may be formed of substantially the same material as that of the control gate pattern of the cell transistor. A butting structure may be formed on the gate electrode of the peripheral transistor.

In example embodiments, a selection transistor may be formed on the cell area of the substrate during formation of the peripheral transistor. The selection transistor may have substantially the same structure as the peripheral transistor.

In example embodiments, a conductive pattern may be formed on the gate electrode of the selection transistor. The conductive pattern may be electrically connected to the gate electrode of the selection transistor. The conductive pattern may include substantially the same material as that of the control gate pattern of the cell transistor. A butting structure may be formed on the gate electrode of the selection transistor.

According to example embodiments, a pattern for a semiconductor device may be formed on the substantially entire surface of a substrate with a uniformly small thickness. If the pattern is used for the charge storage pattern, variations in the characteristics of the device caused by thickness variation of the storage charge pattern may be reduced, increasing the operation reliability of a non-volatile memory device including the charge storage pattern.

The thickness difference between the charge storage pattern and the gate patterns of the selective transistor and the peripheral transistor may increase the operation reliability of the non-volatile memory device.

BRIEF DESCRIPTION OF THE DRAWINGS

Example embodiments will be more clearly understood from the following detailed description taken in conjunction with the accompanying drawings.

FIGS. 1 to 4 are diagrams illustrating cross-sectional views a method of forming a pattern for a semiconductor device in accordance with example embodiments;

FIGS. 5 to 14 are diagrams illustrating cross-sectional views a method of manufacturing a non-volatile memory device in accordance with example embodiments;

FIGS. 15 and 16 are diagrams illustrating cross-sectional views of a method of manufacturing a non-volatile memory device in accordance with example embodiments;

FIGS. 17 and 18 are diagrams illustrating cross-sectional views of a method of manufacturing a non-volatile memory device in accordance with example embodiments;

FIG. 19 is a diagram illustrating a cross-sectional view of a non-volatile memory device in accordance with example embodiments;

FIGS. 20 to 28 are diagrams illustrating cross-sectional views of a method of forming the non-volatile memory device shown in FIG. 19;

FIG. 29 is a diagram illustrating cross-sectional view taken along a line perpendicular to the cut line of FIG. 28;

FIG. 30 is a diagram illustrating cross-sectional view of a non-volatile memory device in accordance with example embodiments;

FIG. 31 is a diagram illustrating cross-sectional view taken along a line perpendicular to the cut line of FIG. 30; and FIGS. 32 to 34 are diagrams illustrating cross-sectional views of a method of manufacturing the non-volatile memory device shown in FIGS. 30 and 31.

DESCRIPTION OF EXAMPLE EMBODIMENTS

Figure 1:
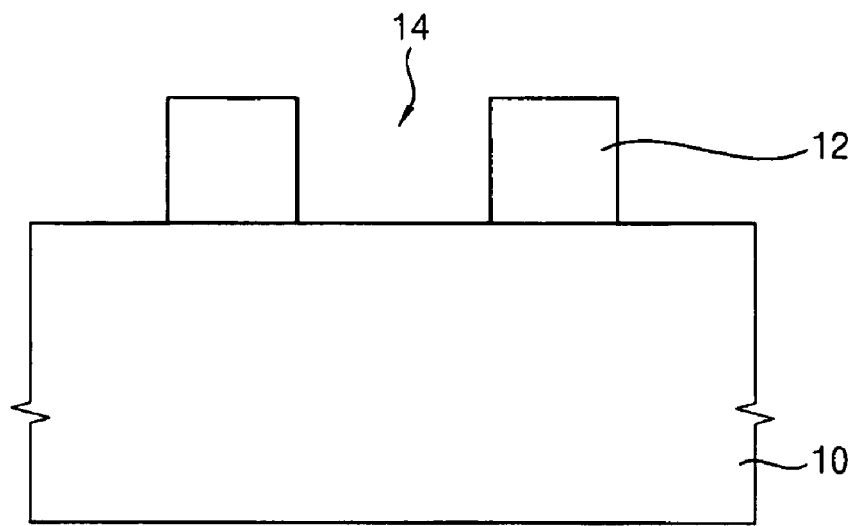
FIGS. 1-34 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Example embodiments relate to a method of forming a pattern for a semiconductor device and a method of forming a charge storage pattern using the same. Other example embodiments relate to a non-volatile memory device including a charge storage pattern and methods of manufacturing the same. Other example embodiments relate to a method of forming a pattern having a smaller and/or more uniform thickness.

FIGS. 1 to 4 are diagrams illustrating cross-sectional views of a method of forming a pattern for a semiconductor device in accordance with example embodiments.

Referring to FIG. 1, a mold pattern 12 may be formed on a substrate 10. The mold pattern 12 may include a space 14 through which the substrate 10 is partially exposed. The mold pattern 12 may include a device isolation pattern that protrudes from the substrate 10 and has a top surface higher than a top surface of the substrate 10. The mold pattern 12 may include an insulation pattern including silicon oxide, silicon nitride or combinations thereof.

Figure 2:
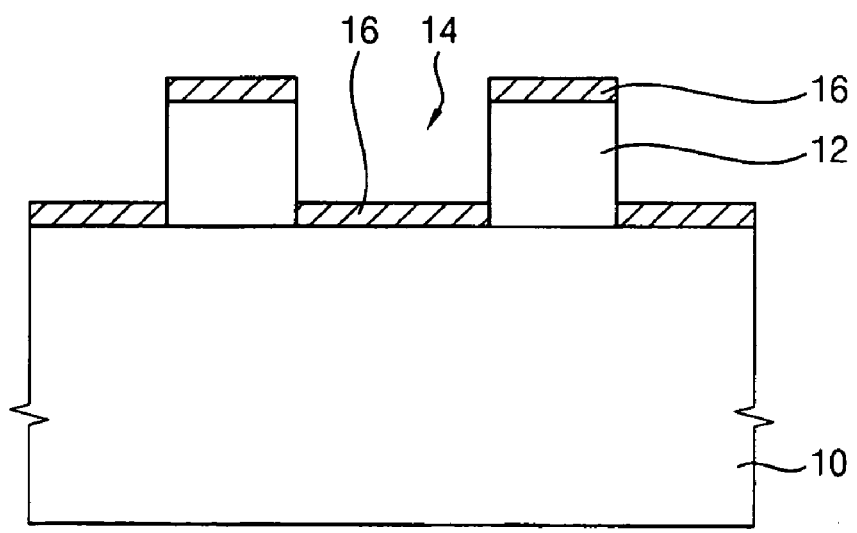

Referring to FIG. 2, a preliminary thin pattern 16 may be selectively formed on a top surface of the mold pattern 12 and on a top surface of the substrate 10 exposed through the space 14 by a deposition process.

The preliminary thin pattern 16 may be formed with a thickness less than that of the mold pattern 12 on the substrate 10. The space 14 may be partially filled with the preliminary thin pattern 16. The preliminary thin pattern 16 may be formed with a thickness of about 10 Å to about 500 Å. The preliminary thin pattern 16 may be formed with a thickness of about 10 Å to about 50 Å. In example embodiments, the preliminary thin pattern 16 may be formed with a substantially small thickness of about 10 Å to about 50 Å.

In a conventional process, a thin layer is conformally formed on the substrate along a profile of the mold pattern, and the thin layer is partially removed from an inner surface of the space corresponding to a sidewall of the mold pattern, to form a conventional preliminary thin pattern.

In example embodiments, the thin layer may not be formed on the inner surface (or sidewall) of the space 14. As such, no additional process may be necessary to remove the thin layer from the inner surface of the space 14. The preliminary thin pattern 16 may be formed on the substrate 10 and on the mold pattern 12 by performing the deposition process without an additional removal process. As such, non-uniform removal of the thin layer from the inner surface of the space 14 may be avoided (or not necessary) because it is not necessary to remove the thin layer from the inner surface of the space 14 to form the preliminary thin pattern 16 with a substantially uniform thickness.

In example embodiments, the preliminary thin pattern 16 may be formed by a deposition process having poor sidewall step coverage characteristics. The preliminary thin pattern 16 may be positioned only on the mold pattern 12 and on the substrate 10 exposed through the space 14. The preliminary thin pattern 16 may be formed by a physical vapor deposition (PVD) process or a chemical vapor deposition (CVD) process having poor sidewall step coverage characteristics (e.g., a high-density plasma CVD (HDP-CVD) process). In example embodiments, the preliminary thin pattern 16 may be formed on the mold pattern 12 and on the substrate 10 exposed through the space 14 by the HDP-CVD process.

Figure 3:
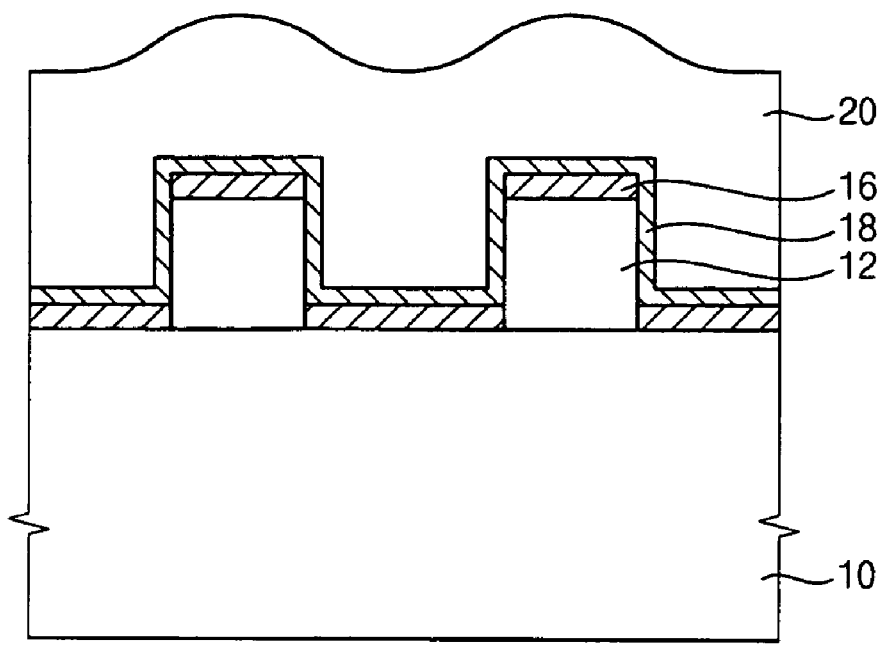

Referring to FIG. 3, a protective layer 18 may be formed on the inner surface of the space 14 and the preliminary thin pattern 16 formed on the mold pattern 12. The protective layer 18 may be formed on (or conform to) the substrate 10 along a surface profile of a structure on the substrate 10. The protective layer 18 may function as a stop layer for a subsequent polishing process. The protective layer 18 may protect the preliminary thin pattern 16 in a subsequent etching process. The protective layer 18 may include a material having an etching selectivity with respect to the preliminary thin pattern 16. In other example embodiments, the protective layer 18 may not be formed on the substrate 10.

A sacrificial layer 20 may be formed on the protective layer 18 to a sufficient (or desired) thickness to fill up the space 14.

Figure 4:
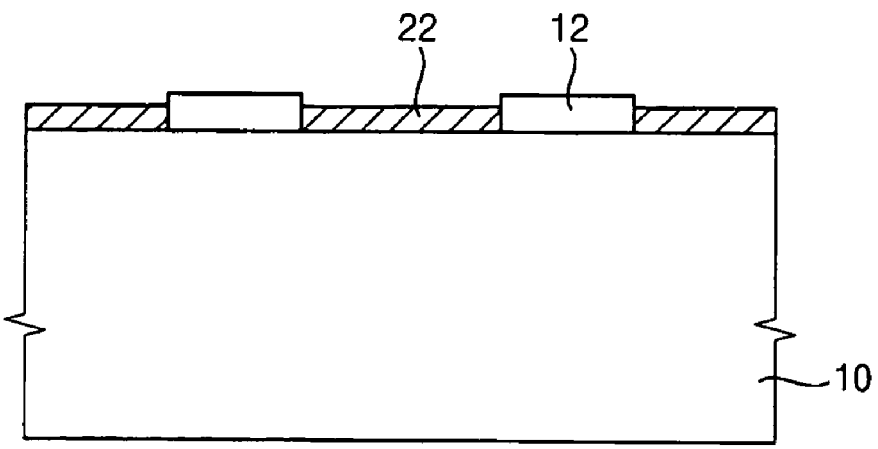

Referring to FIG. 4, the sacrificial layer 20 may be polished by performing a polishing process until the protective layer 18 is exposed. The polishing process may include a CMP process. The protective layer 18 may function as a stop layer for the polishing process.

The exposed protective layer 18 may be removed from the preliminary thin pattern 16 by a CMP process, a dry etching process, a wet etching process or the like.

The preliminary thin pattern 16 may be removed from the mold pattern 12 by a CMP process, a dry etching process, a wet etching process or similar process to expose a top surface of the mold pattern 12. The preliminary thin pattern 16 on the substrate 10 may be covered with the protective layer 18 and the sacrificial layer 20. The preliminary thin pattern 16 may not be removed from the substrate 10. As such, the preliminary thin pattern 16 remains only on the substrate 10 exposed through the space 14.

The sacrificial layer 20 in the space 14 may be removed from the protective layer 18, exposing the protective layer 18 in the space 14. In example embodiments, the mold pattern 12 may be partially removed from the substrate 10 in a removal process of the sacrificial layer 20 such that the thickness of the mold pattern 12 decreases. The mold pattern 12 may have a sufficient (or desired) thickness such that it remains on the substrate 10 after the removal process for the sacrificial layer 20. The sacrificial layer 20 may be removed from the protective layer 18 by a CMP process or a dry etching process in the space 14. The protective layer 18 may protect the preliminary thin pattern 16 on the substrate 10 in the above CMP or etching process. The protective layer 18 may function as a polish-stop layer or an etch-stop layer.

The protective layer 18 may be removed from the preliminary thin pattern 16 to expose the preliminary thin pattern 16 on the substrate 10. The protective layer 18 may be removed by performing a wet etching process in order to minimize (or decrease) damage to the surface of the preliminary thin pattern 16 caused by the removal process of the protective layer 18.

A thin pattern 22 and the mold pattern 12 may be formed on the substrate 10. The mold pattern 12 may be located (or formed) at side portions of the thin pattern 22. Top surfaces of the thin pattern 22 and the mold pattern 12 may be exposed.

The thin pattern 22 may be formed from the preliminary thin pattern 16, which is on the substrate 10 and exposed through the space 14, without performing a removal process on the preliminary thin pattern 16 in the space 14. It is not necessary to perform a removal process (e.g., a polishing process and an etching process) on the preliminary thin pattern 16 in the space 14, after depositing the preliminary thin pattern 16. The deposition thickness of the preliminary thin pattern 16 may be substantially the same as the thickness of the thin pattern 22. The thin pattern 22 may have substantially the same deposition thickness of the preliminary thin pattern 16 without any removal in a process subsequent to the deposition process. As such, the thin pattern 22 may have a substantially uniform thickness along the entire surface of the substrate 10. As such, the thin pattern is formed on the substrate between the mold patterns with a substantially small thickness of about 50 Å.

FIGS. 5 to 14 are diagrams illustrating cross-sectional views of a method of manufacturing a non-volatile memory device in accordance with example embodiments.

Figure 5:
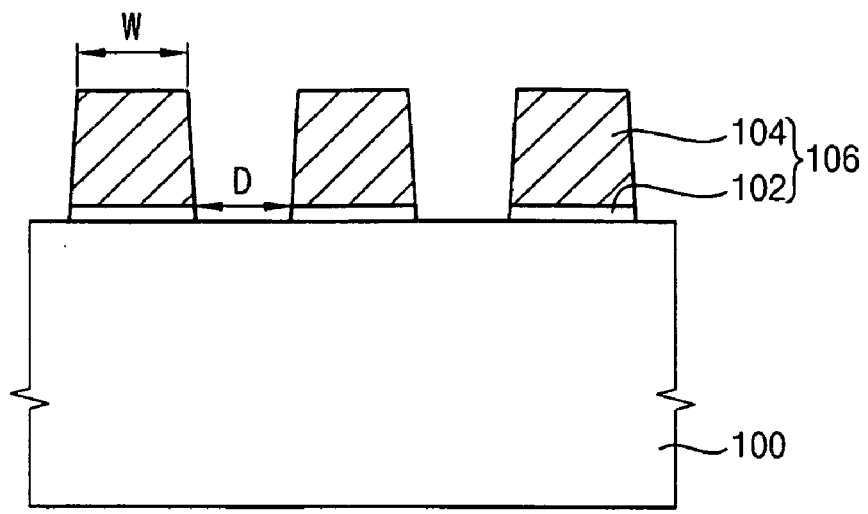

Referring to FIG. 5, a pad oxide layer (not shown) may be formed on a substrate 100 including a semiconductor material (e.g., silicon). The pad oxide layer may be formed with a thickness of about 10 Å to about 100 Å by performing an oxidation process with a surface of the substrate 100. The pad oxide layer may prevent a subsequent silicon nitride layer from directly contacting the substrate 100.

A silicon nitride layer (not shown) may be formed on the pad oxide layer. The silicon nitride layer may function as a hard mask pattern for forming a device isolation trench in a subsequent process. The silicon nitride layer may have a sufficient (or desired) thickness such that it remains on the pad oxide layer after an etching process for forming the device isolation trench is performed. The silicon nitride layer may be formed with a thickness of about 3,000 Å to about 5,000 Å.

A photoresist pattern (not shown) may be formed on the silicon nitride layer by performing a photolithography process. A device isolation region (e.g., a field region of the substrate) may be exposed through the photoresist pattern. The silicon nitride layer and the pad oxide layer may be sequentially etched by performing an etching process using the photoresist pattern as an etching mask to form a mask pattern structure 106 on the substrate 100. The mask pattern structure 106 may include a pad oxide pattern 102 and a silicon nitride pattern 104 sequentially stacked. The photoresist pattern may be removed from the mask pattern structure 106 by performing an ashing process and a stripping process.

In example embodiments, the silicon nitride pattern 104 may have a slanted sidewall positioned (or arranged) such that a lower portion is larger than an upper portion thereof. The mask pattern structure 106 may extend in a first direction on the substrate 100. A plurality of the mask pattern structures 106 may be arranged in parallel with one another in a second direction perpendicular to the first direction by a gap distance D. A line width W and the gap distance D of the mask pattern structure 106 may be formed to be less than about 90 nm.

Figure 6:
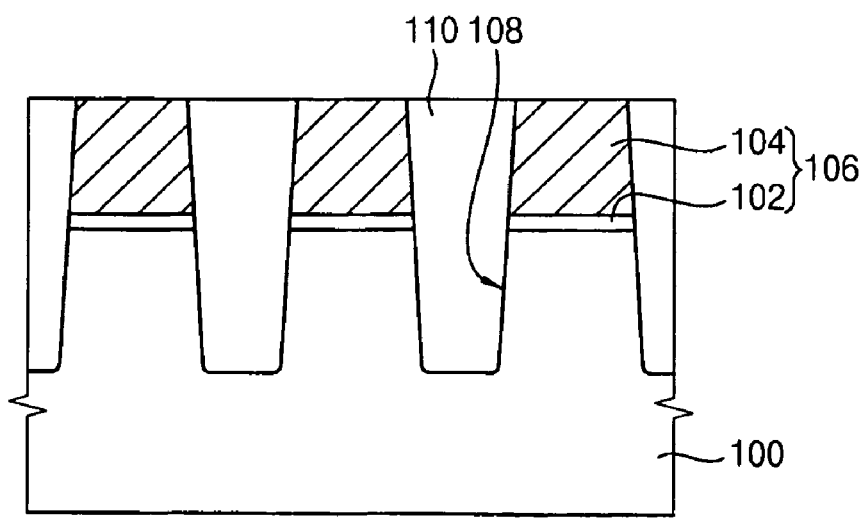

Referring to FIG. 6, the substrate 100 may be etched by performing an etching process using the mask pattern structure 106 as an etching mask to form the device isolation trench 108 in the substrate 100. The device isolation trench 108 may be formed to a depth of about 1,000 Å to about 5,000 Å.

A thermal oxidation process may be performed on an inner surface of the device isolation trench 108 to form an inner oxide layer (not shown) on the inner surface of the trench. The inner oxide layer may have a thickness of about 50 Å to about 250 Å. The inner oxide layer may prevent (or reduce) damage to silicon of the inner surface caused by collision of high energy ions in the above etching process for forming the device isolation trench 108. The inner oxide layer may prevent (or reduce) current leakage through the inner surface of the device isolation trench 108.

An insulation layer (not shown) may be formed on the substrate 100 including the trench 108 to a sufficient (or desired) thickness to fill up the device isolation trench 108 by a deposition process. The insulation layer may include silicon oxide layer formed of a material such as undoped silicate glass (USG), tetraethyl orthosilicate (TEOS) an oxide material or the like. The insulation layer may be formed by depositing the material by a high-density plasma CVD process.

An upper portion of the insulation layer may be partially removed from the substrate 100 by a planarization process (e.g., a CMP process) until a top surface of the mask pattern structure 106 is exposed. As such, the insulation layer remains only in the device isolation trench 108, forming a device isolation pattern 110. A top surface of the device isolation pattern 110 may be higher than the surface of the substrate 100.

Figure 7:
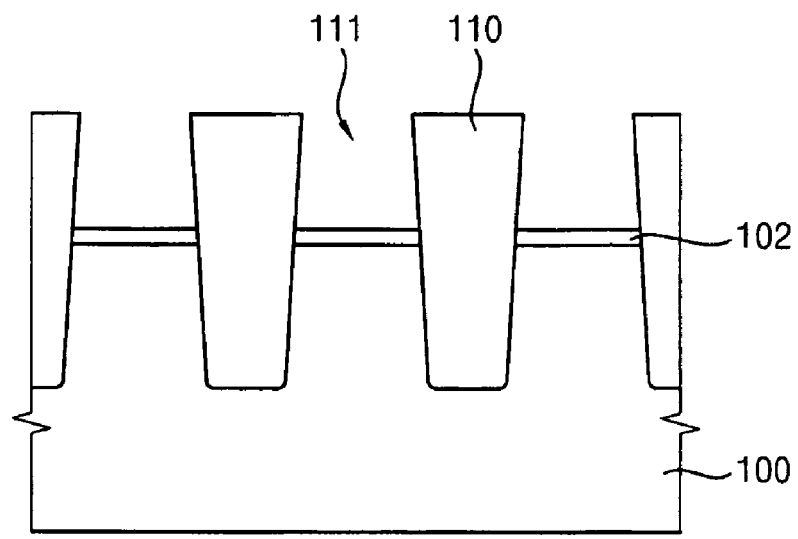

Referring to FIG. 7, the silicon nitride pattern 104 may be removed from the substrate 100 by wet etching process to form a preliminary opening 111 through which the pad oxide layer 102 is exposed. The preliminary opening 111 may have a slanted sidewall such that a lower portion is larger than an upper portion thereof.

Various oxides or particles may be removed from the silicon nitride pattern 104 by performing a cleaning process using a diluted aqueous hydrogen fluoride (HF) solution. The silicon nitride pattern 104 may be etched by performing an etching process using an etchant including phosphoric acid ($H_3PO_4$).

Although not shown in FIG. 7, an upper sidewall of the device isolation pattern 110 may be removed from the substrate 100 in the above etching process for removing the silicon nitride pattern 104 to control a slope of the sidewall of the preliminary opening 111. If an upper portion of the silicon nitride pattern 104 is removed from the substrate by the etching process, the upper portion of the device isolation pattern 110 may be removed from the substrate 100. The upper sidewall of the device isolation pattern 110 may be substantially perpendicular to an upper surface of the residual silicon nitride pattern 104. The residual silicon nitride pattern 104 may be removed from the pad oxide pattern 102 by the same etching process.

Figure 8:
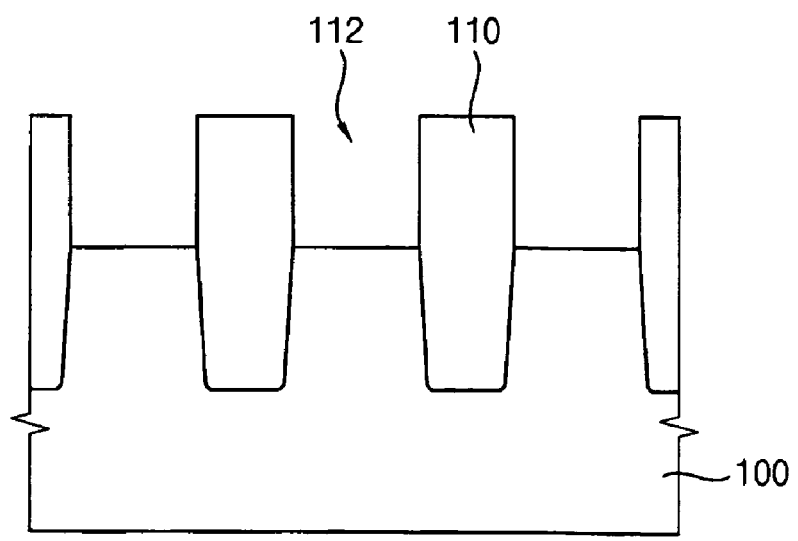

Referring to FIG. 8, the pad oxide pattern 102 exposed through the preliminary opening 111 may be removed from the substrate 100 to form an opening 112 through which the substrate 100 is exposed. The pad oxide pattern 102 may be removed from the substrate 100 by performing a wet etching process such that damage to the substrate 100 caused by the etching process for removing the pad oxide pattern 102 may be minimized (or reduced). For example, an etchant for the wet etching process may include a mixture of ammonium hydroxide ($NH_4OH$), hydrogen peroxide ($H_2O_2$) and water ($H_2O$), which is known in the art as a standard cleaning 1 (SC1) or a standard cleaning 2 (SC2) solution.

Because the pad oxide pattern 102 and the device isolation pattern 110 may be formed of the same material (e.g., silicon oxide), a sidewall of the device isolation pattern 110 may be partially removed in the wet etching process for removing the pad oxide pattern 102.

The pad oxide pattern 102 may be formed on the substrate 100 by performing a thermal oxidation process. The device isolation pattern 110 may be formed on the pad oxide pattern 102 by performing a CVD process. As such, the pad oxide pattern 102 may have a more compact crystal structure than the device isolation pattern 110. If the pad oxide pattern 102 and the device isolation pattern 110 are etched (or removed) by the same wet etching process, the device isolation pattern 110 may be more rapidly etched (or removed) than the pad oxide pattern 102. An upper corner portion of the device isolation pattern 110 may be etched (or removed) more rapidly than any other portions thereof because the etching process is simultaneously performed against a top surface and a side surface of the device isolation pattern 110.

An upper portion of the device isolation pattern 110 may be removed from the substrate 100 in the wet etching process for removing the pad oxide pattern 102, deforming a profile of the opening 112. A profile of the side surface of the device isolation pattern 110 may vary in accordance with process conditions of the wet etching process. The profile of the opening 112 may vary in accordance with the profile of the side surface of the device isolation pattern 110. The inner surface of the opening 112, or the side surface of the device isolation pattern 110, may be perpendicular to the substrate 110 by controlling the process conditions of the wet etching process for removing the pad oxide pattern 102.

Figure 9:
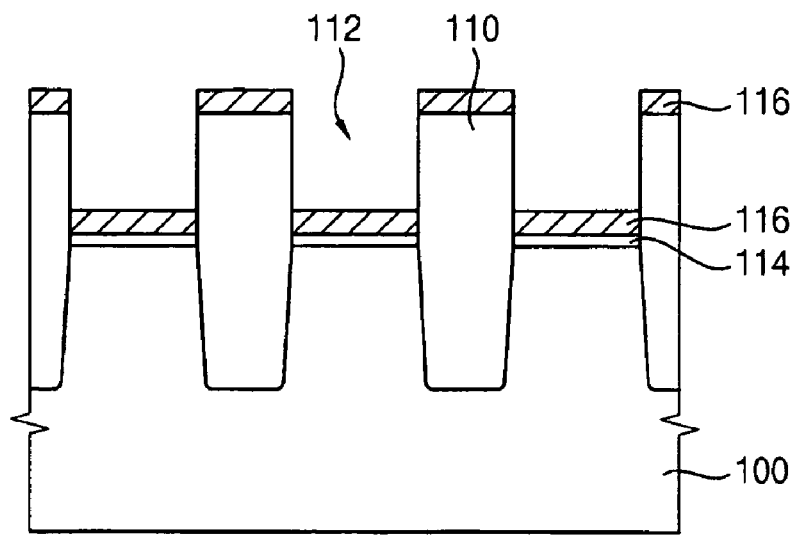

Referring to FIG. 9, a thermal oxidation process may be formed on a surface of the substrate 100 in the opening 112 to form a tunnel oxide layer 114 on the substrate 100. The tunnel oxide layer 114 may include an oxide doped with fluorine (F), carbon (C), a material having a low dielectric constant or the like.

Conductive materials may be selectively deposited on a top surface of the device isolation pattern 110 and on a surface of the tunnel oxide layer 114 to form a first preliminary floating gate pattern 116. Examples of the conductive materials may include polysilicon doped with impurities, a metal, a conductive ceramic material and the like. The preliminary first floating gate pattern 116 may include polysilicon doped with impurities.

The first preliminary floating gate pattern 116 may have a thickness less than an upper portion of the device isolation pattern 110 that protrudes from the surface of the substrate 100. The opening 112 may be partially filled with the first preliminary floating gate pattern 116. The first preliminary floating gate pattern 116 may be formed with substantially the same thickness as a floating gate pattern formed in a subsequent process. If the first preliminary floating gate pattern 116 is formed to a thickness less than about 10 Å, the electric charges may not be captured (or trapped) in the floating gate pattern of a non-volatile memory device. If the first preliminary floating gate pattern 116 is formed with a thickness greater than about 500 Å, interference between neighboring cells may increase. The first preliminary floating gate pattern 116 may be formed with a thickness of about 10 Å to about 500 Å. The first preliminary floating gate pattern 116 may be formed with a thickness of about 10 Å to about 50 Å.

Deposition of the conductive materials onto the inner surface of the opening 112 in the above deposition process is avoided. As such, the first preliminary floating gate pattern 116 may be formed on the substrate 100 without performing additional patterning processes. The first preliminary floating gate pattern 116 may be formed on the tunnel oxide layer 114 and on the device isolation pattern 110 by performing the deposition process without an additional removal process. As such, non-uniform removal of a thin layer from the inner surface of the opening 112 may be avoided because it is not necessary to remove the thin layer from the inner surface of the opening 112 to form the first preliminary floating gate pattern 116 with a uniform thickness.

The first preliminary floating gate pattern 116 may be formed by a deposition process having poor sidewall step coverage characteristics. The first preliminary floating gate pattern 116 may be positioned only on the device isolation pattern 110 and on the tunnel oxide layer 114 exposed through the opening 112. The first preliminary floating gate pattern 116 may be formed by a PVD process or a CVD process having poor sidewall step coverage characteristics (e.g., a high-density plasma CVD (HDP-CVD) process). The first preliminary floating gate pattern 116 may be formed on the device isolation pattern 110 and on the tunnel oxide layer 114 exposed through the opening 112 by the HDP-CVD process.

Figure 10:
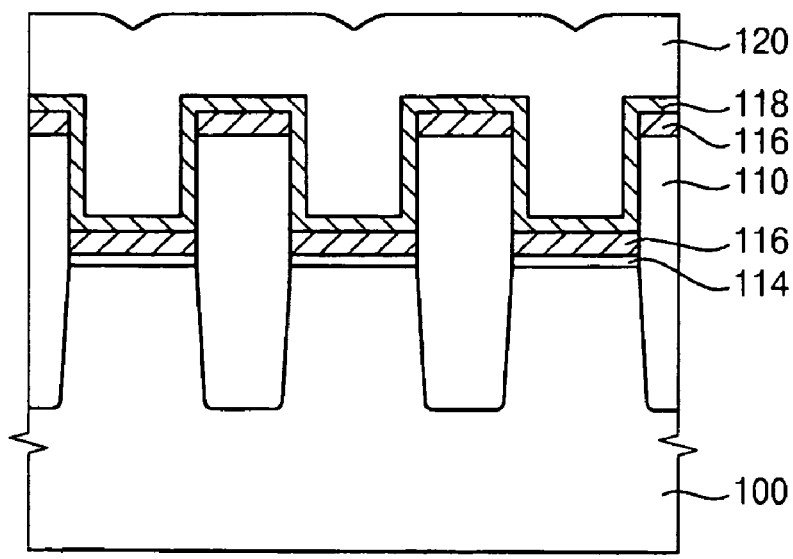

Referring to FIG. 10, a protective layer 118 may be formed on the inner surface of the opening 112 and on the first preliminary floating gate pattern 116 positioned on the tunnel oxide layer 114. The protective layer 118 may be formed on (or conform to) the device isolation pattern 110 along a surface profile of a structure on the substrate 100. The protective layer 118 may function as a stop layer for a subsequent polishing process. The protective layer 118 may protect the first preliminary floating gate pattern 116 in a subsequent etching process. The protective layer 118 may include a material having an etching selectivity with respect to the first preliminary floating gate pattern 116. The protective layer 118 may include silicon nitride. The protective layer 118 may be formed on the substrate 100 by a CVD process.

If the protective layer 118 is formed with a thickness less than about 10 Å, the first preliminary floating gate pattern 116 may not be protected by the protective layer. If the protective layer 118 is formed with a thickness greater than about 100 Å, the protective layer 118 may not be removed from the first preliminary floating gate pattern 116 in a subsequent process. As such, the protective layer 118 may be formed with a thickness of about 10 Å to about 100 Å. The protective layer 118 may be formed with a thickness of about 20 Å.

The protective layer 118 may not be formed on the substrate 100. In such a case, the first preliminary floating gate pattern 116 functions as the stop layer for a subsequent polishing process.

A sacrificial layer 120 may be formed on the protective layer 118 to a sufficient (or desired) thickness to fill up the opening 112. The sacrificial layer 120 may include silicon oxide. The sacrificial layer 120 may include a middle temperature oxide (MTO).

Because the inner surface of the opening 112 is substantially perpendicular to the substrate 100, the sacrificial layer 120 may be formed in the opening 112 without any voids to minimize (or reduce) process defects caused by voids in the opening 112 in a subsequent process for removing the sacrificial layer 120.

Figure 11:
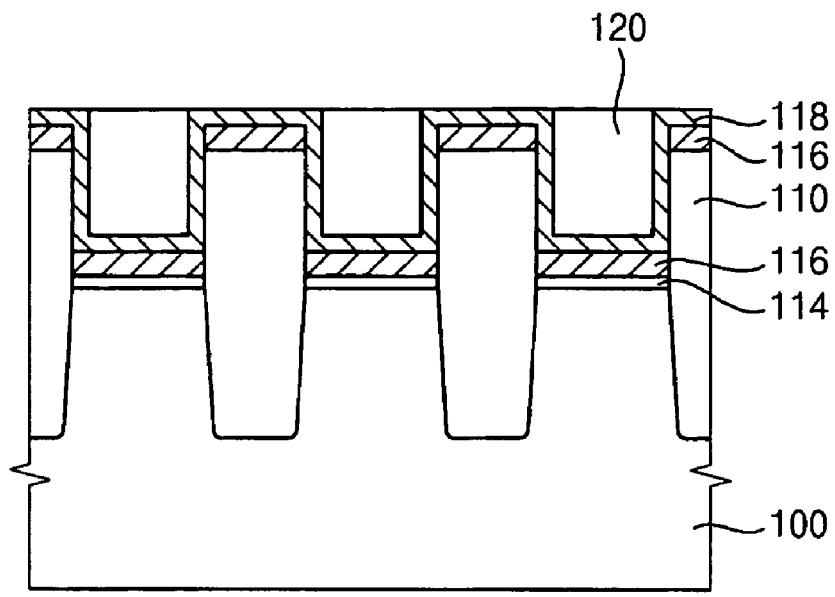

Referring to FIG. 11, an upper portion of the sacrificial layer 120 may be removed by a planarization process until a top surface of the protective layer 118 is exposed. The planarization process may include a CMP process. The protective layer 118 may function as a stop layer for the CMP process.

Figure 12:
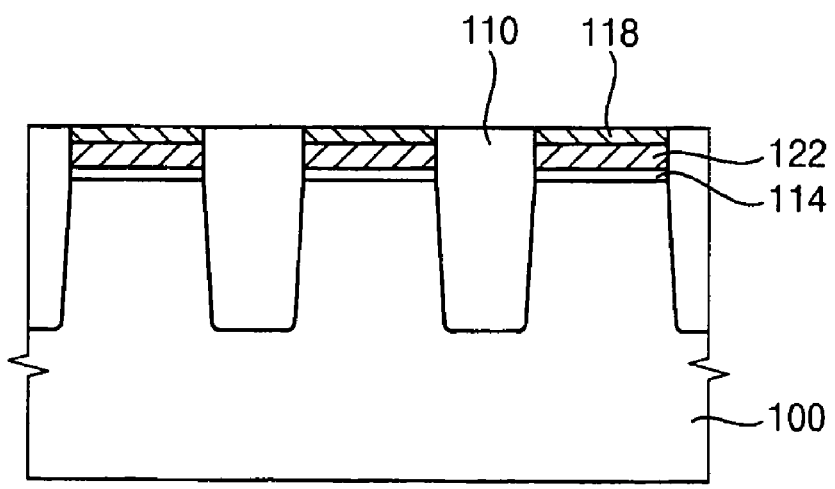

Referring to FIG. 12, the protective layer 118 over the device isolation pattern 110 may be removed from the first preliminary floating gate pattern 116 by performing a CMP process, a dry etching process or a wet etching process.

The first preliminary floating gate pattern 116 may be removed from the device isolation pattern 110 by performing a CMP process, a dry etching process or a wet etching process, exposing a top surface of the device isolation pattern 110. The first preliminary floating gate pattern 116 on the tunnel oxide layer 114 may be covered with the protective layer 118 and the sacrificial layer 120 in the opening 112. The first preliminary floating gate pattern 116 may not be removed from the tunnel oxide layer 114. As such, the first preliminary floating gate pattern 116 may remain only on the tunnel oxide layer 114 in the opening 112. Hereinafter, the first preliminary floating gate pattern 116 remaining on the tunnel oxide layer 114 is referred to as a second preliminary floating gate pattern 122 for differentiating from the first preliminary floating gate pattern 116 on the device isolation pattern 110.

The sacrificial layer 120 in the opening 112 may be removed from the protective layer 118 by a CMP or a dry etching process. The protective layer 118 may be exposed through the opening 112. The device isolation pattern 110 may be partially removed from the substrate 100 in a removal process of the sacrificial layer 120 such that the thickness of the device isolation pattern 110 may decrease. The protective layer 118 on the second preliminary floating gate pattern 122 may function as a polish-stop layer or an etch-stop layer in a process for removing the protective layer 118.

The sacrificial layer 120, a portion of the protective layer 118, the first preliminary floating gate pattern 116 on the device isolation pattern 110 and an upper portion of the device isolation pattern 110 may be removed from the substrate 100 by only performing a CMP process. The protective layer 118 may remain only on the second preliminary floating gate pattern 122.

Figure 13:
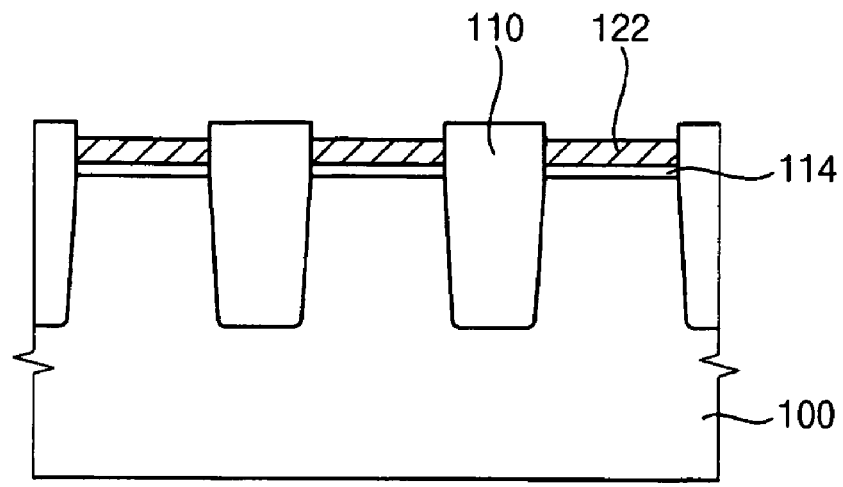

Referring to FIG. 13, the protective layer 118 may be removed from the second preliminary floating gate pattern 122 to expose the second preliminary floating gate pattern 122 on the tunnel oxide layer 114. A wet etching process may be performed on the protective layer 118 for removing the protective layer 118 to minimize (reduce) damage to the surface of the second preliminary floating gate pattern 116 caused by the removal process of the protective layer 118.

The tunnel oxide layer 114 and the second preliminary floating gate pattern 122 may be sequentially formed on the substrate 100 in the opening 112 between the neighboring device isolation patterns 110 without any patterning process for forming the second preliminary floating gate pattern 122 in the opening 112. The thickness of the second preliminary floating gate pattern 122 may be substantially the same as the deposition thickness of the first preliminary floating gate pattern 116. As such, the second preliminary floating gate pattern 122 may have a uniform thickness along the surface (or entire surface) of the substrate 100.

The inner surface of the opening 112 may be substantially perpendicular to the surface of the substrate 100. The sidewall of the second preliminary floating gate pattern 122 in the opening 112 may be substantially perpendicular to the surface of the substrate 100. An upper portion of the second preliminary floating gate pattern 122 may have a larger size than that of the second preliminary floating gate pattern 122, having the slanted sidewall. As such, the contact surface area between the second preliminary floating gate pattern 122 and a dielectric layer (shown in FIG. 14) may be substantially large.

Figure 14:
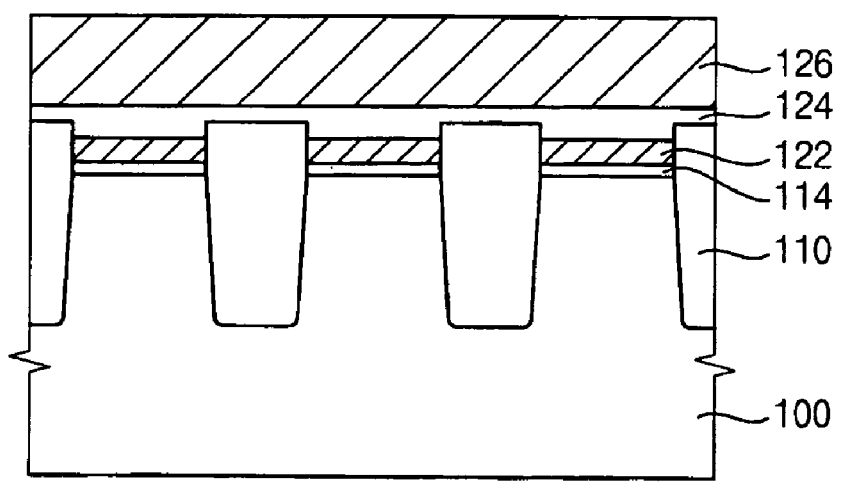

Referring to FIG. 14, a dielectric layer 124 may be formed on the second preliminary floating gate pattern 122 and the device isolation pattern 110. The dielectric layer 124 may include a metal oxide layer, or a multi-layer structure in which a first silicon oxide layer, a silicon nitride layer and a second silicon oxide layer are stacked.

The floating gate pattern of the non-volatile memory device may have a substantially small thickness. The metal oxide layer having a high dielectric constant may be used as the dielectric layer 124 to increase a coupling ratio. Examples of the metal oxide may include yttrium oxide ($Y_2O_3$), hafnium oxide ($HfO_2$), niobium oxide ($Nb_2O_5$), barium titanate ($BaTiO_3$), strontium titanate ($SrTiO_3$) or compositions thereof. The metal oxide layer may be formed by an atomic layer deposition (ALD) process or a metal-organic CVD (MOCVD) process.

An upper conductive layer 126 may be formed on the dielectric layer 124. The upper conductive layer 126 may include doped polysilicon, a metal, a metal silicide or combination thereof. The upper conductive layer 126 may include a metal (e.g., tungsten (W), tungsten silicide (WSi), titanium (Ti), titanium nitride (TiN), titanium silicide (TiSi) or combinations thereof). The upper conductive layer 126 may include a single-layer or a multi-layer structure in which at least two metal layers are stacked.

The upper conductive layer 126 may be patterned into a control gate pattern. The control gate pattern may be shaped into a line extending in a second direction substantially perpendicular to the first direction. The dielectric layer 124, the second preliminary floating gate pattern 122 and the tunnel oxide layer 114 may be sequentially patterned into a dielectric pattern, a floating gate pattern and a tunnel oxide pattern, respectively.

Impurities may be implanted into surface portions of the substrate adjacent to the floating gate pattern to form source/drain regions (not shown) in the surface of the substrate 100.

The above-described processing steps may form a NAND flash memory device in accordance with example embodiments.

Figure 15:
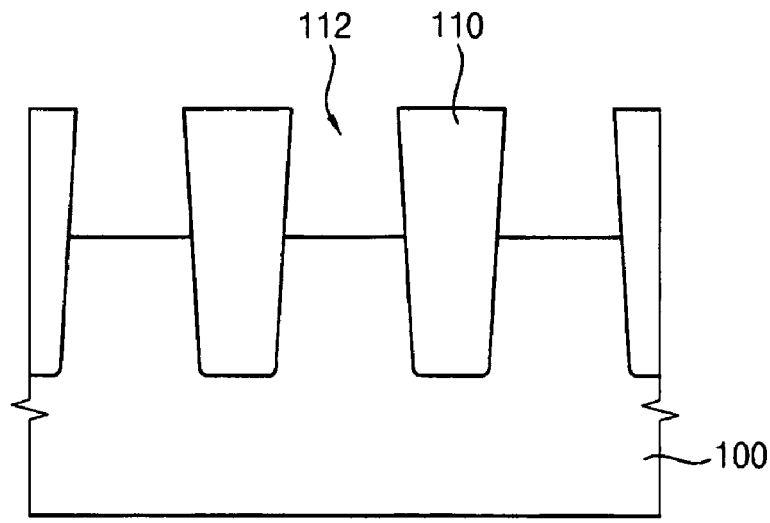
Figure 16:
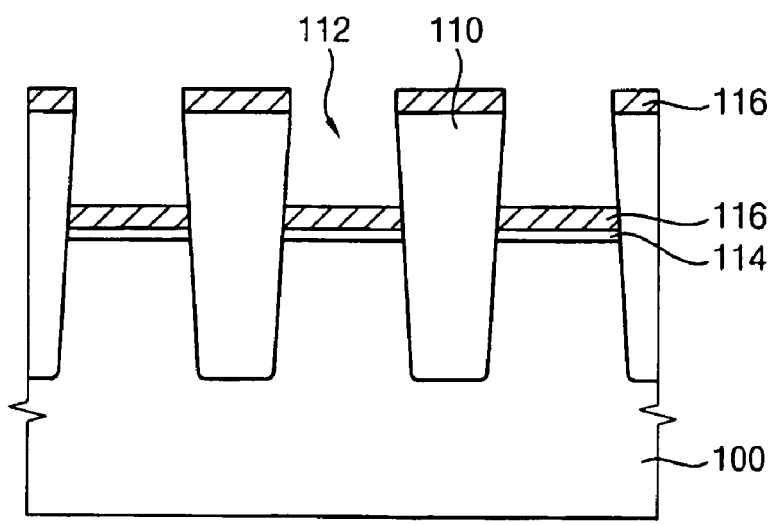

FIGS. 15 and 16 are diagrams illustrating cross-sectional views of a method of manufacturing a non-volatile memory device in accordance with example embodiments.

The method described with reference to FIGS. 15 and 16 is similar to the method described with reference to FIGS. 5 to 14, except for the shape of the device isolation pattern protruding from the surface of the substrate.

After performing the processing steps as described with reference to FIGS. 5 and 6, the silicon nitride pattern and the pad oxide pattern (elements 104 and 102 in FIGS. 5 and 6), may be removed from the substrate by a wet etching process to form an opening 112, as shown in FIG. 15. The sidewall of the device isolation pattern 110 may not be removed from the substrate in an etching process for removing the pad oxide pattern such that the original shape of the device isolation pattern 110 may remains the same. As such, the pad oxide pattern may be thinner to allow for more rapid removal (or etching) from the substrate.

The same process as described with reference to FIG. 8 is performed on the substrate in order to form the tunnel oxide layer 114 and the first preliminary floating gate pattern 116 on the substrate 100 as shown in FIG. 16. According to example embodiments, the inner surface of the opening 112 may be negatively slanted. As such, the deposition of conductive materials on the inner surface of the opening 112 and/or formation of the second preliminary floating gate pattern 116 on the inner surface of the opening 112 may be prevented (or reduced).

Similar processing steps as described with reference to FIGS. 9 to 14 may be performed on the resultant structure of the substrate 100 to form the NAND memory device according to example embodiments.

Figure 17:
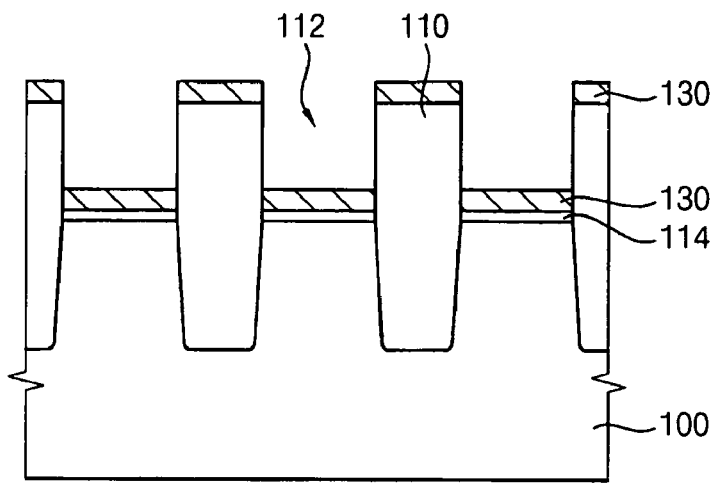
Figure 18:
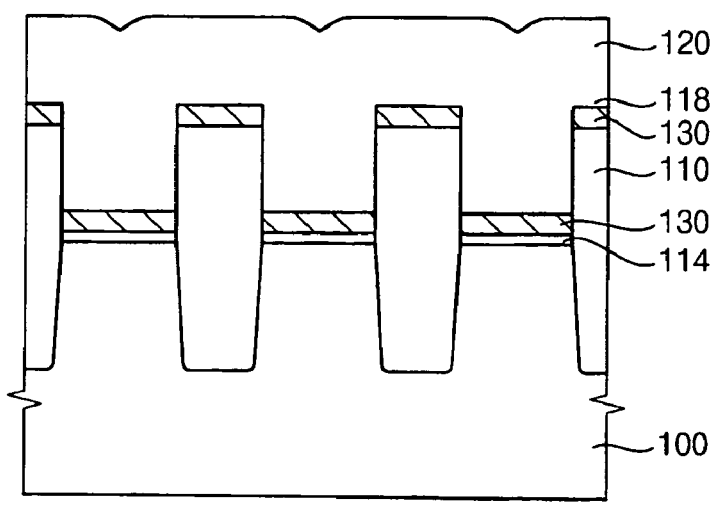

FIGS. 17 and 18 are diagrams illustrating cross-sectional views of a method of manufacturing a non-volatile memory device in accordance with example embodiments.

The method described with reference to FIGS. 17 and 18 is similar to the method described with reference to FIGS. 1-4, except that a charge trap pattern is formed in place of the floating gate pattern and the processing step for forming the protective layer is omitted.

After performing the processing steps as described with reference to FIGS. 5 to 8, a thermal oxidation process may be performed on the substrate 100 exposed through the opening 112 between the device isolation patterns 110 to form the tunnel oxide layer 114 on the substrate 110 in the opening 112, as shown in FIG. 17. A charge trap layer 130 may be formed on the device isolation pattern 110 and the tunnel oxide layer 114.

The charge trap layer 130 may include silicon nitride or an oxide material having a substantially high dielectric constant.

The charge trap layer 130 may not be formed on the inner surface (or sidewall) of the opening 112. The charge trap layer may be changed (or formed) into the charge trap pattern without performing additional patterning processes. The charge trap layer 130 may be formed by a PVD process or a CVD process. The CVD process may include an HDP-CVD process.

Referring to FIG. 18, the sacrificial layer 120 may be formed on the substrate including the charge trap layer 130 to a sufficient (or desired) thickness to fill up the opening 112 between the device isolation patterns 110. The sacrificial layer 120 may include silicon oxide.

If the charge trap layer 130 includes silicon nitride, a protective layer (e.g., layer 118 shown in FIG. 10) may not be necessary. Even if the charge trap layer 130 includes metal oxide, the protective layer may not be necessary.

An upper portion of the sacrificial layer 120 may be removed from the substrate 100 by a planarization process (e.g., a CMP process) until a top surface of the charge trap layer 130 is exposed. The exposed charge trap layer 130 may be removed from the device isolation pattern 110 by a CMP process, a dry etching process, a wet etching process or the like.

The sacrificial layer 120 in the opening 112 may be removed from the charge trap layer 130. An upper portion of the device isolation pattern 110 may be removed in the above removal process of the sacrificial layer 120 to form a preliminary charge trap pattern on the substrate exposed through the opening 112.

A dielectric layer (not shown) and an upper conductive layer (not shown) may be formed on the substrate including the preliminary charge trap pattern. A patterning process may be performed on the substrate including the dielectric layer and the upper conductive layer to form a control gate pattern, a dielectric pattern, a charge trap pattern and a tunnel oxide pattern on the substrate, as described above with reference to FIG. 14.

According to example embodiments, the charge trap pattern may be formed instead of a floating gate pattern (e.g., pattern 122 shown in FIG. 14).

Figure 19:
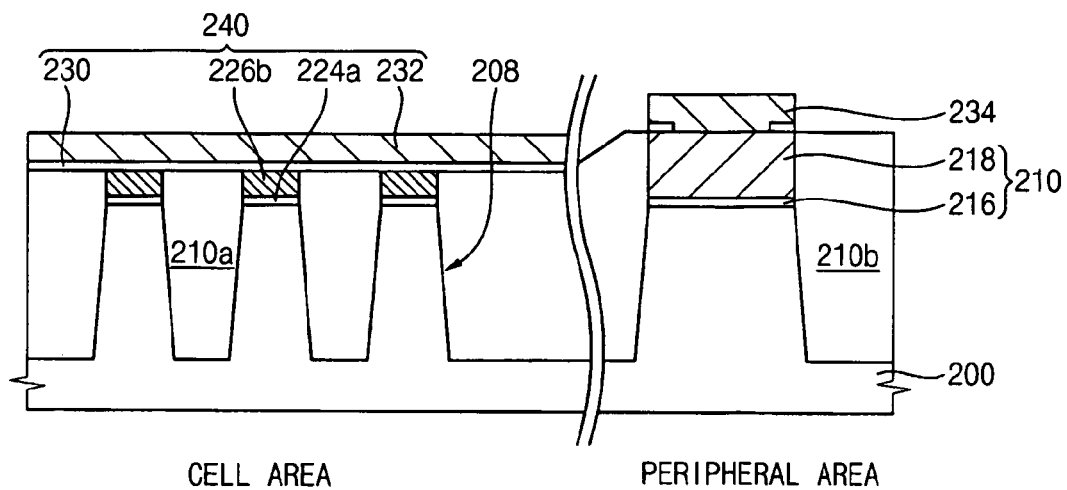

FIG. 19 is a diagram illustrating a cross-sectional view of a non-volatile memory device in accordance with example embodiments.

Referring to FIG. 19, a substrate 200 is defined into a cell area and a peripheral area. A device isolation pattern 210a may be formed in the cell area of the substrate 200. A device isolation pattern 210b may be formed the peripheral area of the substrate 200. An active region on which various conductive structures are formed, and a device isolation region for defining the active region, may be provided in each of the cell and peripheral areas of the substrate 200.

A cell transistor 240 may be positioned on the cell area of the substrate 200. The cell transistor 240 may include a tunnel oxide pattern 224a, a charge storage pattern 226b, a dielectric layer 230 and a control gate pattern 232 that are sequentially stacked on the substrate 200.

The tunnel oxide pattern 224a may be formed by performing a thermal oxidation process. The tunnel oxide pattern 224a may include silicon oxide.

The charge storage pattern 226b may function as a floating gate pattern. The charge storage pattern 226b may include a conductive material (e.g., polysilicon). The charge storage pattern 226b may function as a charge trap pattern. The charge storage pattern 226b may include silicon nitride or a metal oxide.

The charge storage pattern 226b may have a small thickness of about 20 Å to about 500 Å. The charge storage pattern 226b has a small thickness of about 100 Å to about 300 Å. The dielectric layer 230 may include a multi-layer structure in which a first silicon oxide layer, a silicon nitride layer and a second silicon oxide layer are stacked. The dielectric layer 230 may include a metal oxide layer having a dielectric constant higher than that of the silicon nitride. The control gate pattern may include a conductive material.

A plurality of the cell transistors 240 may be arranged on the cell area of the substrate 200 as a string. A selection transistor (not shown) may be electrically connected to front and rear cell transistors in series, respectively. The selection transistor may have substantially the same stacked structure as the cell transistor. A butting structure may not be formed in a gate pattern of the selection transistor. A gate pattern of the selection transistor may have a line width larger than that of the cell transistor.

A peripheral transistor 270 may be positioned on the peripheral area of the substrate 200. The peripheral transistor 270 includes a gate insulation layer 216, a gate pattern 218 and source/drain regions (not shown). The gate pattern 218 may include a conductive material (e.g., polysilicon, a metal, a metal silicide or the like). The gate pattern 218 may include the same material as that of the control gate pattern of the cell transistor. The gate pattern 218 may include a material different from the control gate pattern of the cell transistor.

The gate pattern 218 of the peripheral transistor may have a substantially low electrical resistance. As such, the gate pattern 218 of the peripheral transistor 270 may have a thickness greater than the charge storage pattern 226b. The gate pattern 218 of the peripheral transistor 270 may be thicker than the charge storage pattern 226b by at least about 100 Å.

A gate pattern 218 of the peripheral transistor 270 may have a butting structure at an upper portion thereof. A conductive pattern 234, which is formed of the same material as that of the control gate pattern 232 of the cell transistor, may be electrically connected to the upper portion of the gate pattern 218. The conductive pattern 234 may be formed on the gate electrode of the peripheral transistor 270.

FIGS. 20 to 28 are diagrams illustrating cross-sectional views of a method of forming the non-volatile memory device shown in FIG. 19. FIG. 29 is a diagram illustrating a cross-sectional view taken along a line perpendicular to the cut line of FIG. 28.

Figure 20:
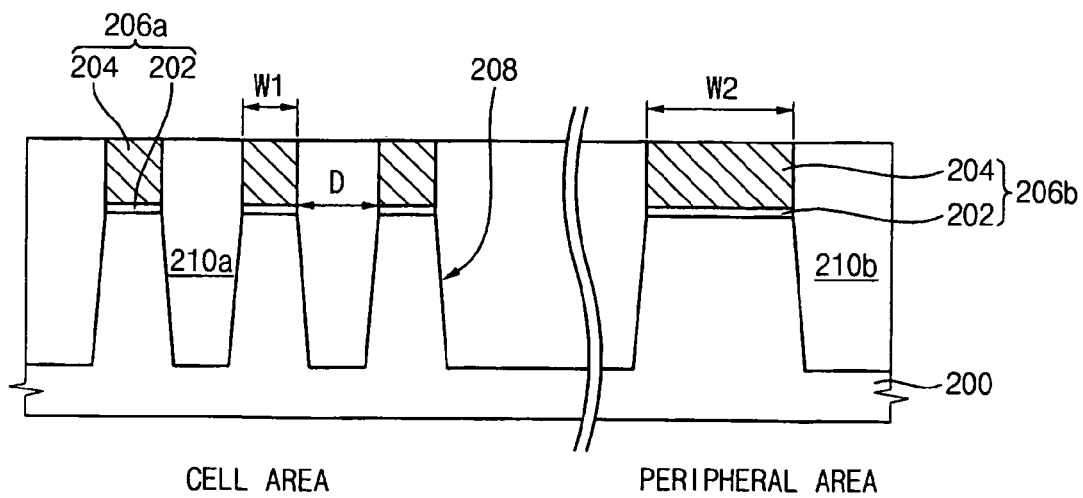

Referring to FIG. 20, the substrate 200 (e.g., a semiconductor wafer) is provided. A cell area and a peripheral area are defined on the substrate 200.

A first mask pattern structure 206a and a second mask pattern structure 206b may be formed on the substrate 200. Each of the mask pattern structures 206a and 206b may include a pad oxide pattern 202 and a silicon nitride pattern 204. The first mask pattern structure 206a may be formed on the cell area of the substrate 200. A line width $W_1$ and a gap distance $D_1$ of the pattern structure 206a may be relatively small at a substantially high density. The second mask pattern structure 206b may be formed on the peripheral area of the substrate 200. A line width $W_2$ and a gap distance (not shown) of the pattern structure 206b may be relatively large at a relatively low density.

The substrate 200 may be etched (or removed) by an etching process using the first and second mask pattern structures 206a and 206b as an etching mask to form a device isolation trench 208. An inner oxide (not shown) may be formed on an inner surface of the device isolation trench 208.

An insulation layer (not shown) may be formed on the substrate 200 to a sufficient (or desired) thickness to fill up the device isolation trench 208 by performing a deposition process. An upper portion of the insulation layer may be removed by performing a planarization process (e.g., a CMP process) until surfaces of the first and second mask pattern structures 206a and 206b are exposed. As such, the insulation layer remains only in the device isolation trench 208 to form first and second device isolation patterns 210a and 210b in the cell area and the peripheral area, respectively, of the substrate 200. The first device isolation pattern 210a may have a substantially small width. The second device isolation pattern 210b may have a substantially large width.

Figure 21:
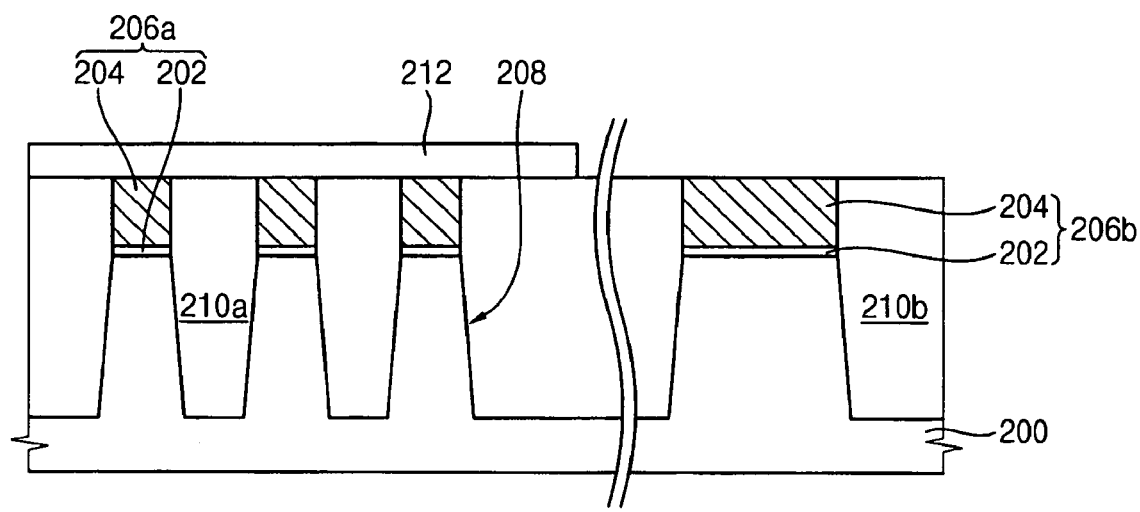

Referring to FIG. 21, a first mask layer (not shown) may be formed on the silicon nitride pattern 204 and on the first and second device isolation patterns 210a and 210b. The first mask layer may include the same material (e.g., silicon oxide) as the first and second device isolation patterns 210a and 210b. The first mask layer may be formed by a CVD process (e.g., a plasma-enhanced CVD (PECVD) process).

A photoresist film may be formed on the first mask layer. The photoresist film may be patterned to a photoresist pattern (not shown). The photoresist pattern may cover the first mask layer corresponding to the silicon nitride pattern 204 and the first device isolation pattern 210a on the cell area of the substrate 200.

The first mask layer may be patterned into a first mask pattern 212 by an etching process using the photoresist pattern as an etching mask. The cell area of the substrate 200 may be covered with the first mask pattern 212.

The photoresist pattern may be removed from the first mask pattern 212 by performing an ashing process and a stripping process to expose the silicon nitride pattern 204 and the second device isolation pattern 210b in the peripheral area of the substrate 200.

While the first mask pattern 212 including silicon oxide is provided for a subsequent etching process, the photoresist pattern may be used for the subsequent etching process in place of the first mask pattern 212.

Figure 22:
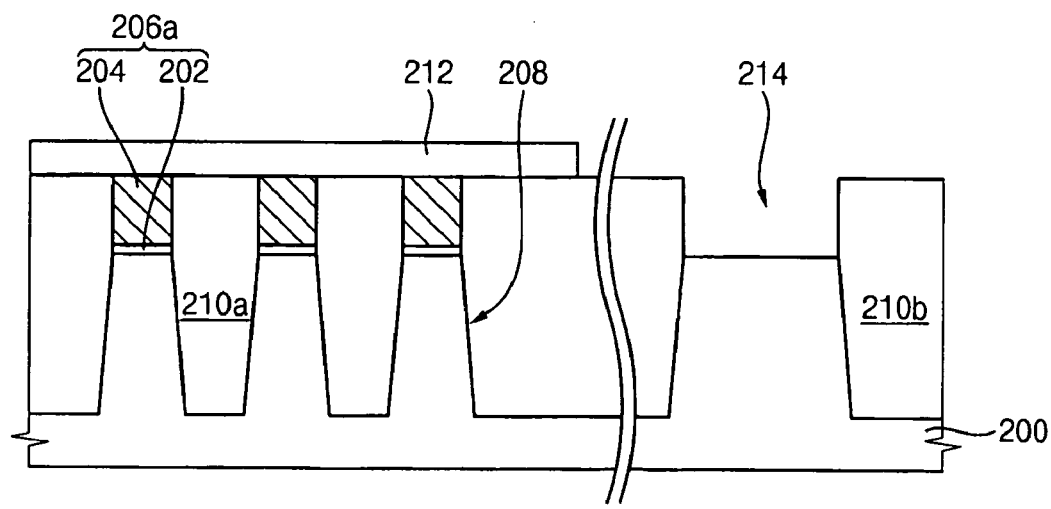

Referring to FIG. 22, the silicon nitride pattern 204 on the peripheral area of the substrate 200 may be selectively removed by performing an etching process using the first mask pattern 212 as an etching mask. A wet etching process may be performed to remove the silicon nitride pattern 204 to prevent (or reduce) damage to the substrate during the etching process.

The pad oxide pattern 202 below the silicon nitride pattern 204 may be removed from the substrate 200 to form a first opening 214 in the peripheral area of the substrate 200. In a subsequent process, a gate electrode of the peripheral transistor is positioned in the first opening 214.

A thickness of the gate electrode of the peripheral transistor may be determined by a depth of the first opening 212. The depth of the first opening 212 may vary in accordance with a deposition thickness of the silicon nitride pattern. The thickness of the gate electrode of the peripheral transistor may be determined by the deposition thickness of the silicon nitride pattern.

Figure 23:
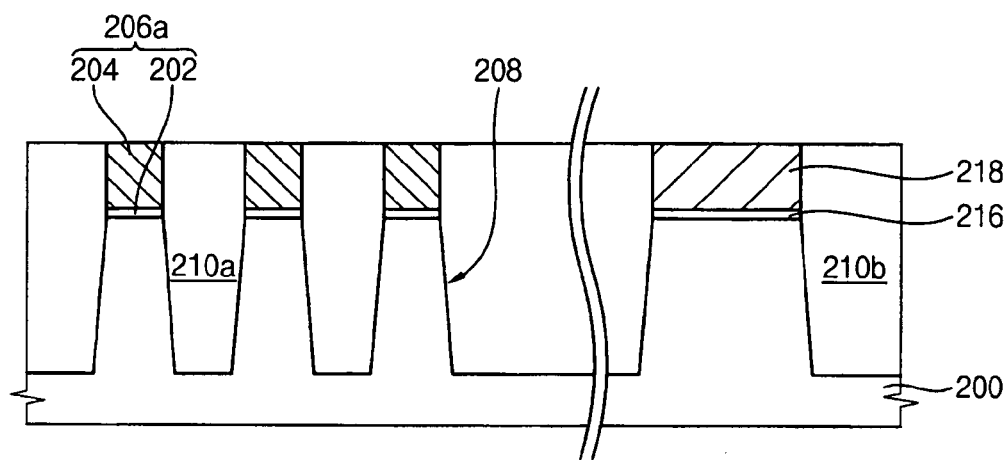

Referring to FIG. 23, a thermal oxidation process may be performed at a bottom surface of the first opening 214 to form a gate insulation layer 216 on the bottom surface of the first opening 214.

A conductive layer (not shown) may be formed on the substrate 200 to a sufficient (or desired) thickness to fill up the first opening 214 by a deposition process. For example, the conductive layer may include a doped polysilicon layer, a metal layer, a metal silicide layer or the like. The conductive layer may have a single-layer structure or a multi-layer structure.

A planarization process (e.g., a CMP process) may be performed against the second conductive layer until a top surface of the second device isolation pattern 210b is exposed to form a gate pattern 218 on the peripheral area of the substrate 200.

The first mask pattern 212 remaining on the cell area of the substrate 200 may be simultaneously removed from the substrate 200 in the above planarization process such that the silicon nitride pattern 204 and the first device isolation pattern 210a are exposed in the cell area of the substrate 200. The gate pattern 218 and the second device isolation pattern 210b may be exposed in the peripheral area of the substrate 200.

Figure 24:
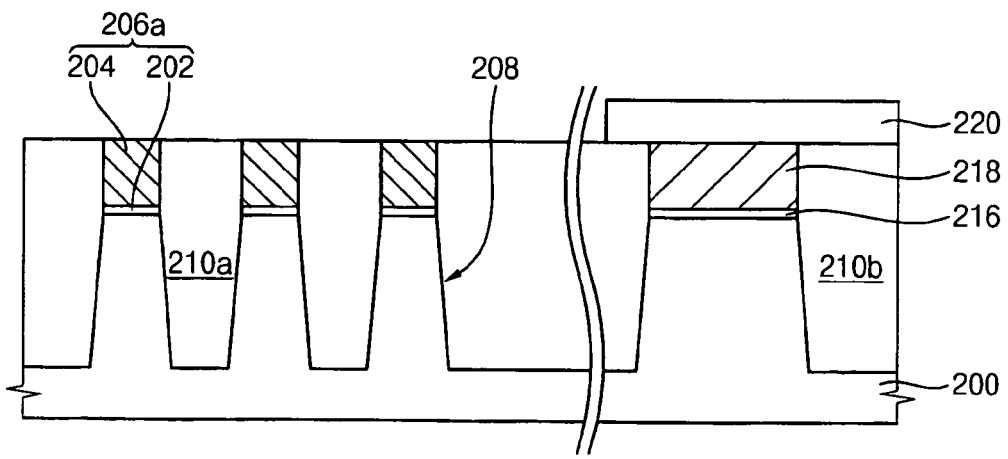

Referring to FIG. 24, a second mask layer (not shown) may be formed on the silicon nitride pattern 204, the gate pattern 218, and the first and second device isolation patterns 210a and 210b. The second mask layer may be formed of the same material (e.g., silicon oxide) as the first and second device isolation patterns 210a and 210b. A photoresist film (not shown) may be formed on the second mask layer. The photoresist film may be patterned into a photoresist pattern. The photoresist pattern may cover the second mask layer in the peripheral area of the substrate. The second mask layer may be etched (or removed) by performing an etching process using the photoresist pattern as an etching mask to form a second mask pattern 220 covering the peripheral area of the substrate 200 and exposing the cell area of the substrate 200.

The photoresist pattern may be removed from the second mask pattern 220 by performing an ashing process and a stripping process to expose the silicon nitride pattern 204 and the first device isolation pattern 210a in the cell area of the substrate 200.

While the second mask pattern 220 including silicon oxide is provided for a subsequent etching process, the photoresist pattern may be used for the subsequent etching process instead of the second mask pattern 220.

Figure 25:
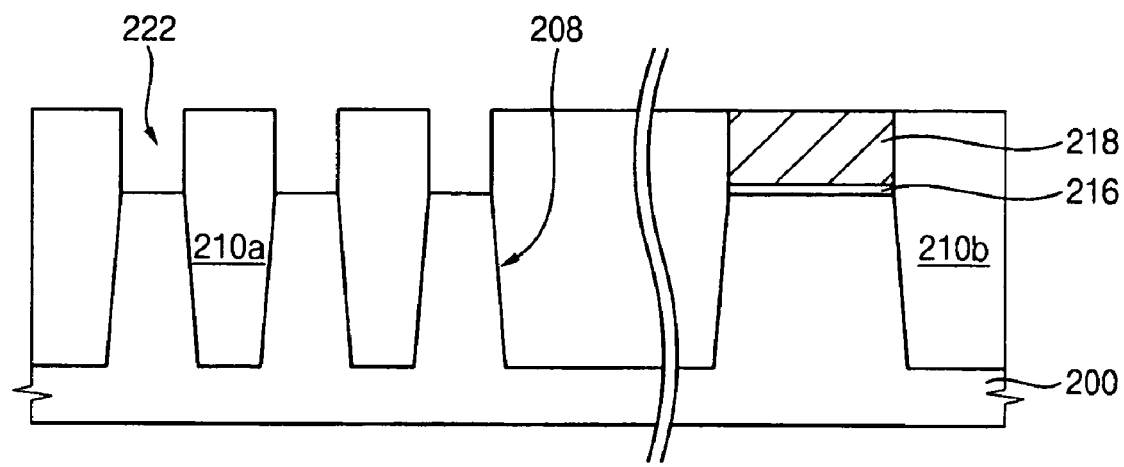

Referring to FIG. 25, the silicon nitride pattern 204 in the cell area of the substrate 200 may be removed from the substrate 200 by performing a wet etching process. The pad oxide pattern 202 under the silicon nitride pattern 204 may be removed from the substrate 200. A second opening 222 may be formed on the cell area of the substrate 200. The surface of the substrate 200 may be exposed through the second opening 222.

Figure 26:
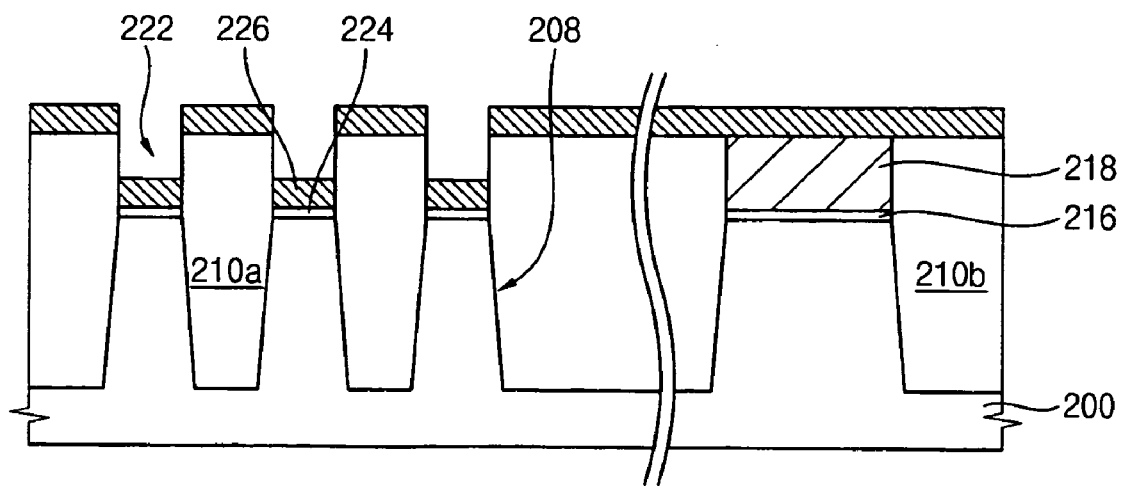

Referring to FIG. 26, a tunnel oxide layer 224 may be formed on a bottom surface of the second opening 222 between neighboring first device isolation patterns 210a. A charge storage layer 226 may be formed on the tunnel oxide layer 224, on the first and second device isolation patterns 210a and 210b and on the gate pattern 218.

The second opening 222 may not be completely filled with the charge storage layer 226. As such, the charge storage layer 226 may be formed in a lower portion of the second opening 222. Formation of the charge storage layer 226 on a sidewall of the second opening 222 may be prevented (or reduced). The charge storage layer 226 may be primarily formed on the bottom of the second opening 222 due to poor step coverage characteristics thereof. The charge storage layer 226 may be formed by a PVD process or an HDP-CVD process.

The charge storage layer 226 may have a thickness of about 20 Å to about 500 Å. The charge storage layer 226 may have a thickness of about 50 Å to about 300 Å.

The thickness of the charge storage layer 226 may be at least 100 Å less than that of the gate pattern 218. The thickness of the gate pattern 218 may be at least about 100 Å greater than that of the charge storage layer 226.

The charge storage layer 226 may include a conductive material (e.g., polysilicon, a metal, a metal silicate or the like). The charge storage layer 226 may include an insulation material (e.g., silicon nitride or silicon oxide). If the charge storage layer 226 includes silicon nitride or a metal oxide, the non-volatile memory device may be manufactured into a charge-trapping transistor.

Figure 27:
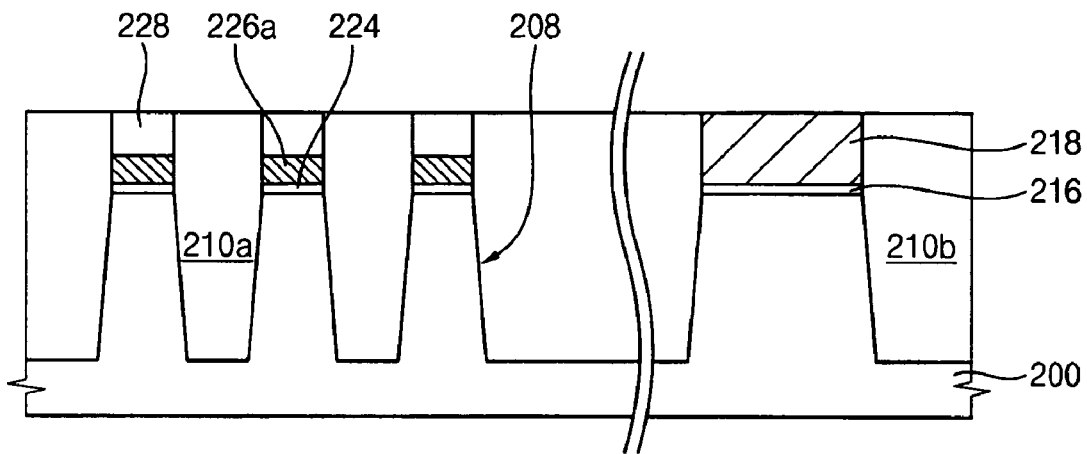

Referring to FIG. 27, a sacrificial layer 228 may be formed on the substrate 200, on which the charge storage layer 226 is located (or formed). The sacrificial layer 228 may be formed to a sufficient (or desired) thickness to fill up the second opening 222 by performing a deposition process. The sacrificial layer may include silicon oxide.

A planarization process may be performed on the sacrificial layer 228. The sacrificial layer 228 may be removed from the first and second device isolation patterns 210a and 210b and the gate pattern 218 by a CMP process or an etching process. As such, the charge storage layer 226 remains only on the tunnel oxide layer 224 to form a preliminary charge storage pattern 226a at a lower portion of the second opening 222.

Figure 28:
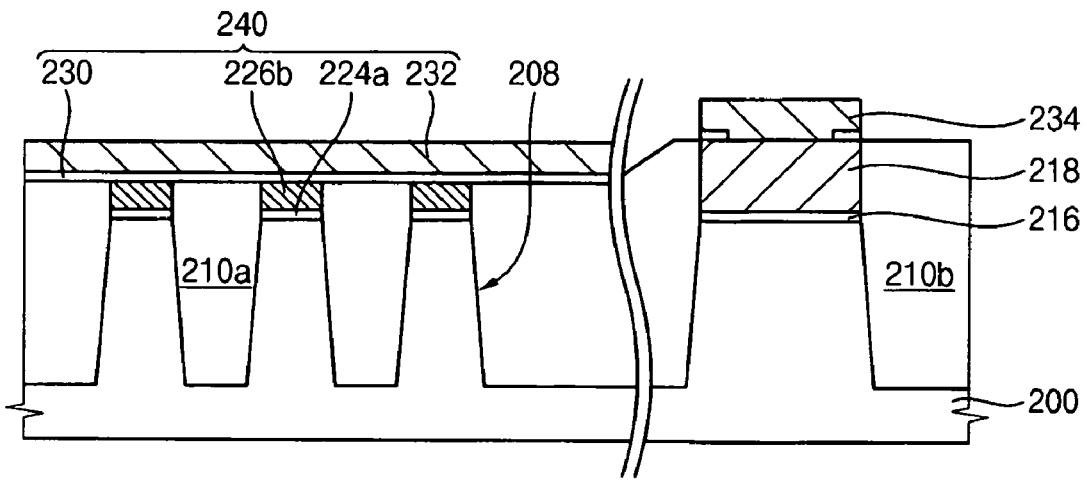
Figure 29:
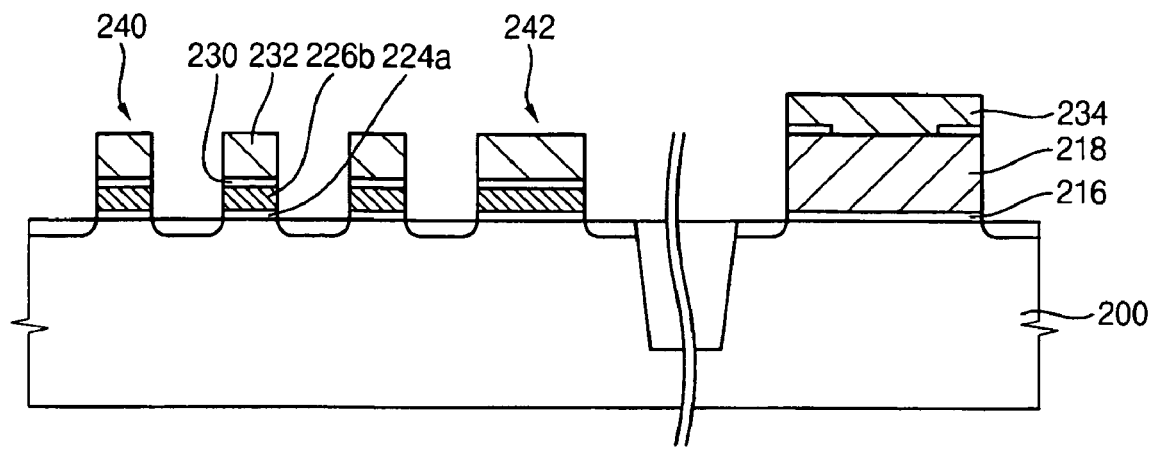

Referring to FIGS. 28 and 29, the sacrificial layer 228 and an upper portion of the first device isolation pattern 210a may be removed from the substrate 200 by a CMP process to expose the preliminary charge storage pattern 226a on the tunnel oxide layer 224 in the cell area. A portion of the gate pattern 218 may be removed from the substrate 200 in the peripheral area during the CMP process.

The preliminary charge storage pattern 226a may be formed with a thickness of about 20 Å to about 500 Å in the cell area. The preliminary charge storage pattern 226a may have a thickness less than that of the gate pattern 218 in the peripheral area.

A dielectric layer (not shown) may be formed on the preliminary charge storage pattern 226a, the first device isolation pattern 210a, the second device isolation pattern 210b, and the gate pattern 218. The dielectric layer may be patterned such that a top surface of the gate pattern 218 is exposed in the peripheral area of the substrate 200.

An electrode layer (not shown) may be formed on the dielectric layer. The electrode layer, the dielectric layer, the preliminary charge storage pattern 226a, and the tunnel oxide layer 224 may be sequentially patterned.

A tunnel oxide pattern 224a, a charge storage pattern 226b, a blocking dielectric pattern 230 and a control gate pattern 232 may be sequentially stacked on the cell area of the substrate 200 to form a cell transistor 240 on the substrate 200. A number of the cell transistors 240 may be arranged in series on the cell area of the substrate 200 similar to a string.

Referring to FIG. 29, a selection transistor 242 may be formed at an end portion of the string of the cell transistors in the same patterning process as the cell transistor 240. The selection transistor 242 may have substantially the same stacked structure as the cell transistor 240. A conductive pattern 234 may be formed on the gate pattern 218. The conductive pattern 234 may be electrically connected to the gate pattern 218 in the peripheral area of the substrate 200 to form a butting structure in the peripheral area of the substrate 200.

The butting structure of the peripheral transistor may reduce electrical resistance of the gate electrode of the peripheral transistor.

If the gate pattern 218 of the peripheral transistor has a substantially small thickness similar to that of the charge storage pattern 226b, a process margin for an etching process may not be sufficiently formed in the gate pattern 218. As such, it may be difficult to form the butting structure on the gate pattern 218 of the peripheral transistor. If the gate pattern 218 of the peripheral transistor has substantially the same thickness of about 30 Å to about 500 Å as the charge storage pattern 226b, the gate pattern 218 may be substantially removed from the gate insulation layer 216 by performing the etching process on the dielectric layer 230 in order to form the butting structure. Removing the gate pattern 218 may cause a process failure. As such, it may be may be difficult to form the butting structure on the gate pattern 218 if the gate pattern 218 does not have a larger thickness.

The gate pattern 218 may have a thickness greater than that of the charge storage pattern 226b. The thickness of the gate pattern 218 may be more easily controlled by adjusting the depth of the second opening 222 irrespective of the charge storage pattern 226b. The gate pattern 218 may have a desirable process margin in the etching process for forming the butting structure.

The dielectric layer and the electrode layer may be removed from the peripheral area of the substrate 200 in the same patterning process. In such a case, the peripheral transistor may include the gate insulation layer 216 and the gate pattern 218 on the gate insulation layer 216. A butting structure may not be formed on the gate pattern of the peripheral transistor.

The gate pattern may not be electrically connected to the electrode layer.

Figure 30:
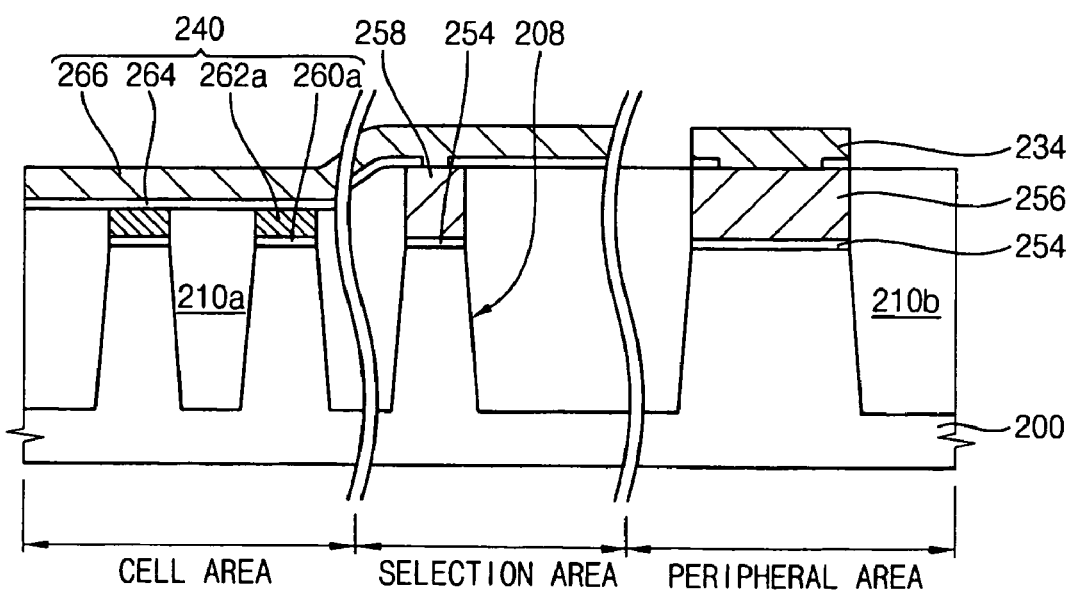
Figure 31:
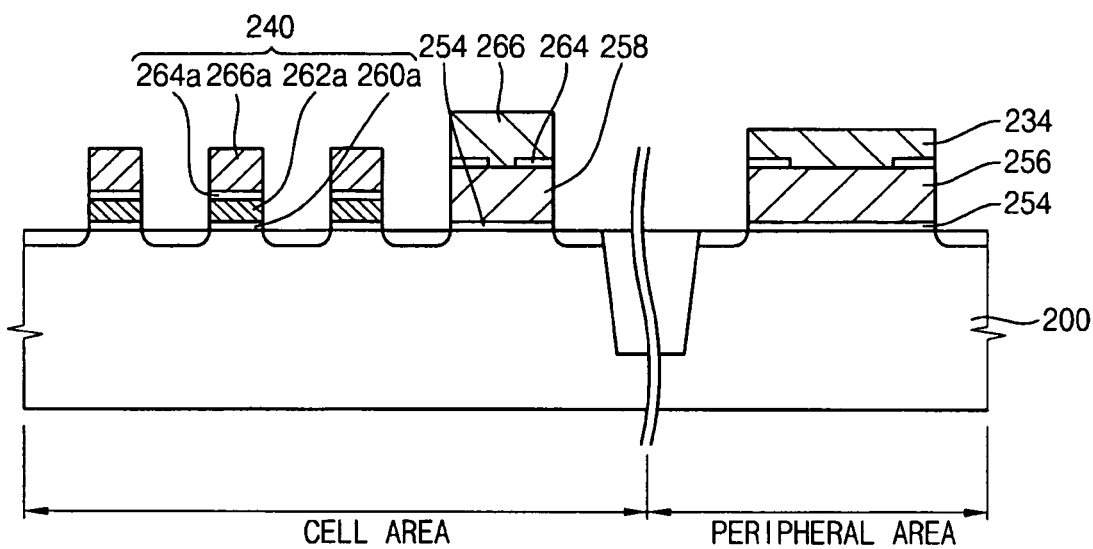

FIG. 30 is a diagram illustrating a cross-sectional view of a non-volatile memory device in accordance with examples embodiment. FIG. 31 is a diagram illustrating cross-sectional view taken along a line perpendicular to the cut line of FIG. 30.

Referring to FIGS. 30 and 31, the substrate 200 (e.g., a semiconductor wafer) is provided. A cell area and a peripheral area are defined on the substrate 200. Device isolation patterns 210a and 210b may be formed on the cell and peripheral areas of the substrate 200, respectively. An active region, in which various conductive structures are to be formed, may be formed on the cell area of the substrate 200. A device isolation region for defining the active region may be formed on the peripheral area of the substrate 200.

A cell transistor 241 may be formed on the cell area of the substrate 200. The cell transistor 241 may include a tunnel oxide pattern 260a, a charge storage pattern 262a, a dielectric pattern 264a and a control gate pattern 266a sequentially stacked on the cell area of the substrate 200. A number of the cell transistors 241 may be electrically connected in series as a cell string. A selection transistor may be located (or formed) at an end portion of the cell string that is referred to as selection area in FIG. 30. The selection transistor may include a gate insulation pattern 254 and a first gate electrode 258 that is stacked on the selection area of the substrate 200.

The tunnel oxide pattern 260a of the cell transistor may include a silicon oxide layer formed by a thermal oxidation process. The charge storage pattern 262a may function as a floating gate. The charge storage pattern 262a may include a conductive material (e.g., polysilicon). The charge storage pattern 262a may function as a charge trap pattern. The charge storage pattern 262a may include silicon nitride or a metal oxide. The charge storage pattern 262a may have a substantially small thickness of about 20 Å to about 500 Å. The charge storage pattern 262a may have a thickness of about 100 Å to about 300 Å.

A dielectric layer 264 is formed on the device isolation pattern 210a, the charge storage pattern 262a and the first gate electrode 258. The dielectric layer 264 may be formed into a multi-layer structure in which a first silicon oxide layer, a silicon nitride layer and a second silicon oxide layer are sequentially stacked on the cell area and the selection area of the substrate 200. The dielectric layer 264 may include a metal oxide having a dielectric constant greater than that of silicon nitride. A conductive layer 266, which may include a conductive material, is formed on the dielectric layer 264 across the cell area and the selection area of the substrate 200. The dielectric layer 264 in the cell area of the substrate 200 is formed into the dielectric pattern 264a of the cell transistor 241 and the conductive layer 266 is formed into the control gate pattern 266a of the cell transistor 241.

The gate insulation pattern 254 of the selection transistor may include silicon oxide formed by a thermal oxidation process. The first gate pattern 258 may include a conductive material (e.g., polysilicon, a metal, a metal silicate or the like). The first gate pattern 258 may be formed to have a single-layer structure or a multi-layer structure. The first gate pattern 258 may have a line width larger than that of the charge storage pattern 262a of the cell transistor 241. The first gate pattern 258 may have a thickness greater than that of the charge storage pattern 262a. The thickness of the first gate pattern 258 may be at least about 100 Å greater than that of the charge storage pattern 262a.

The dielectric layer 264 and the conductive layer 266 in the selection area of the substrate 200 may be formed into a dielectric pattern 264b and a conductive pattern 266b of the selection transistor, and thus the dielectric pattern 264b and the conductive pattern 266b may be sequentially stacked on the first gate pattern 258 of the selection transistor. The dielectric pattern 264b of the selection transistor may be formed of the same material as that of the dielectric pattern 264a of the cell transistor. The conductive pattern 266b of the selection transistor may include the same material as that of the control gate pattern 266a of the cell transistor. The conductive pattern 266b may be electrically connected to the first gate pattern 258 to form a butting structure on the first gate pattern 258 of the selection transistor.

A peripheral transistor may be formed on the peripheral area of the substrate 200. A gate insulation layer 254 and a second gate pattern 256 may be stacked on the substrate 200 to form a gate structure. Source/drain regions may be formed at surface portions of the substrate adjacent to the gate structure. The second gate pattern 256 may include a conductive material (e.g., polysilicon). The second gate pattern 256 may have a thickness greater than that of the charge storage pattern 262a of the cell transistor. The second gate pattern 256 may be thicker than the charge storage pattern 262a by at least about 100 Å. The first gate pattern 258 of the selection transistor may be formed of the same material as that of the second gate pattern 256 of the peripheral transistor.

A conductive pattern 234 may be formed on the second gate pattern 256. The conductive pattern 234 may include the same material as that of the control gate pattern. A dielectric layer may be interposed between the second gate pattern 256 and the conductive pattern 234. The gate structure of the peripheral transistor may include a butting structure.

The dielectric layer and the conductive pattern 234 may be formed on the second gate pattern 256 in the peripheral area of the substrate 100. The dielectric pattern of the peripheral transistor may include the same material as that of the dielectric layer of the cell transistor. The conductive pattern 234 of the peripheral transistor may include the same material as that of the control gate pattern of the cell transistor. The conductive pattern 234 may not be electrically connected to the second gate pattern 256. A butting structure may not be formed on the second gate pattern 256 of the peripheral transistor.

Figure 32:
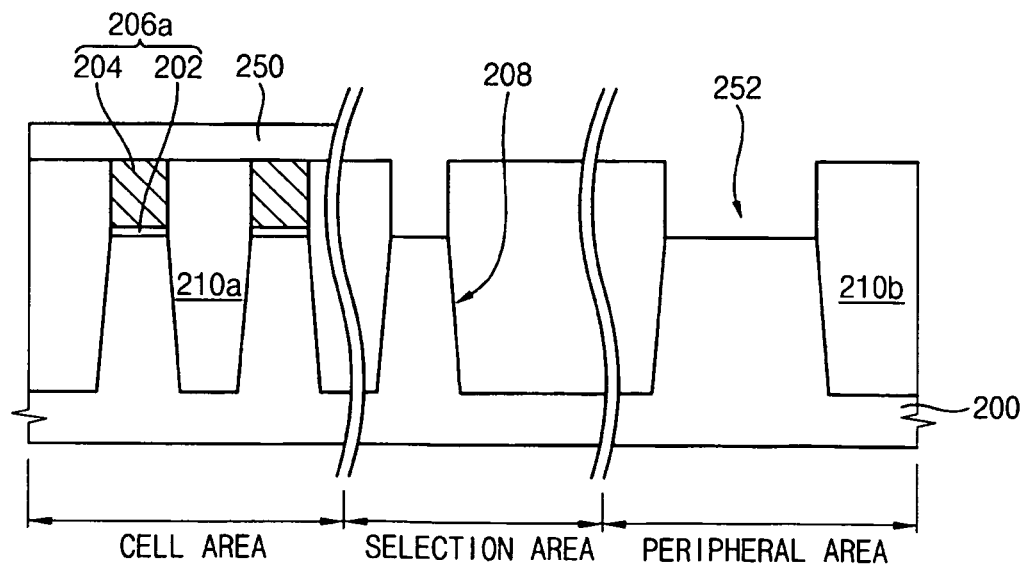
Figure 33:
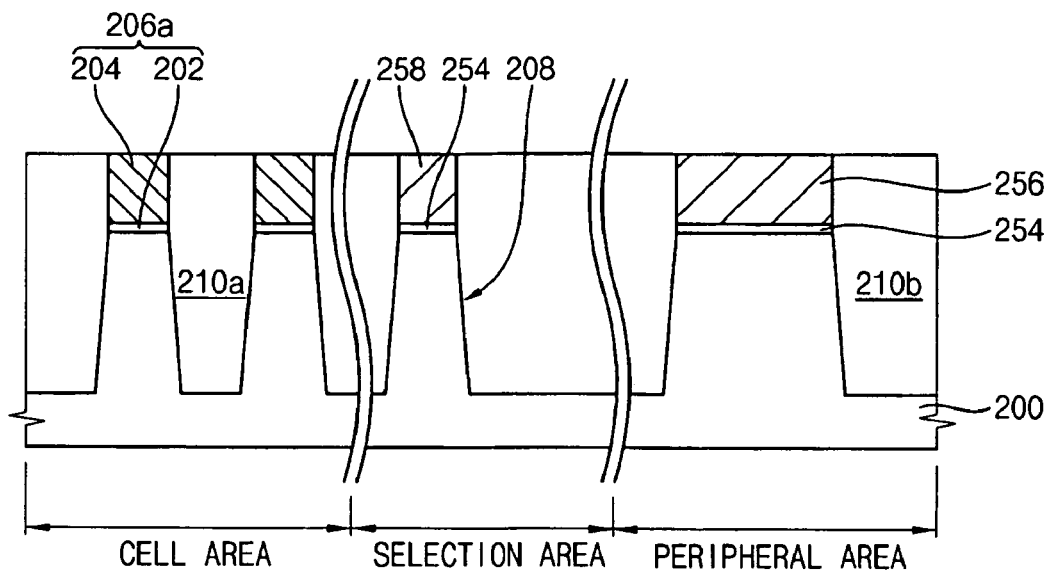
Figure 34:
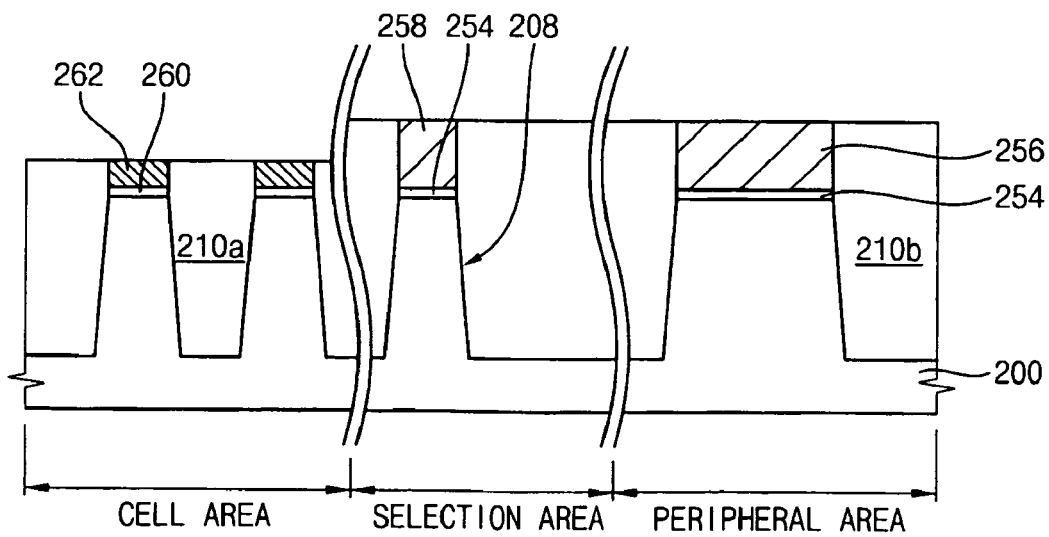

FIGS. 32 to 34 are diagrams illustrating cross-sectional views of a method of manufacturing the non-volatile memory device shown in FIGS. 30 and 31.

Referring to FIG. 32, a cell area and a peripheral area are defined on a surface of a substrate 200. The substrate 200 may include a semiconductor material (e.g., a silicon wafer).

In the same processing steps as described with reference to FIG. 5, first and second mask pattern structures may be formed on the cell and peripheral areas of the substrate 200. The substrate 200 may be etched by an etching process using the first and second mask pattern structures as an etching mask to form a trench 208 in the cell and peripheral areas of the substrate 200. An insulation layer may be formed on the substrate 200 including the trench 208. The insulation layer may be patterned into a first device isolation pattern 210a in the cell area of the substrate 200 and a second device isolation pattern 210b in the peripheral area of the substrate 200.

A first mask pattern 250 may be formed on the substrate 200 including the device isolation patterns 210a and 210b. A portion of the cell area and the peripheral area may be exposed through the first mask pattern 250. A gate electrode of a selection transistor may be formed in the exposed portion of the cell area in a subsequent process. A peripheral transistor for a peripheral circuit may be formed in the exposed peripheral area in a subsequent process. The first mask pattern 250 may include a hard mask pattern including silicon oxide. In other example embodiments, the first mask pattern 250 may include a photoresist pattern.

A portion of the first mask pattern structure 206a corresponding to a gate electrode of a selection transistor and the second mask pattern structure 206b may be removed from the substrate 200 by an etching process using the first mask pattern 250 as an etching mask to form a first opening 252 through which the substrate 200 is exposed.

Referring to FIG. 33, a thermal oxidation process may be performed on a bottom surface of the first opening 252 to form a gate insulation layer 254 on a surface of the substrate 200 exposed through the first opening 252. A conductive layer (not shown) may be formed on the substrate 200 to a sufficient (or desired) thickness to fill up the first opening 252. The conductive layer may include doped polysilicon, a metal, a metal silicide or combinations thereof. The conductive layer may be formed to have a single-layer structure or a multi-layer structure.

An upper portion of the conductive layer may be planarized by performing a planarization process until a surface of the second device isolation pattern 210b is exposed. A first gate pattern 258 of the selection transistor may be formed on the cell area of the substrate 200. A second gate pattern 256 of the peripheral transistor may b formed on the peripheral area of the substrate 200. The first mask pattern 250 may be removed from the substrate 200 by the same planarization process.

Referring to FIG. 34, a second mask pattern (not shown) may be formed on the substrate 200 including the first and second gate patterns 258 and 256. The second mask pattern may cover the peripheral area and a portion of the cell area, in which the selection transistor will be formed. The first mask pattern structure 206a and the first device isolation pattern 210a may be exposed through the second mask pattern in the cell area of the substrate 200.

The first mask pattern structure 206a may be selectively removed from the substrate by an etching process to form a second opening (not shown) on the cell area of the substrate 200. The etching process may include a wet etching process.

The tunnel oxide layer 260 and the preliminary charge storage pattern 262 may be formed in the second opening. The tunnel oxide layer 260 and the preliminary holding pattern 262 may be formed by the same process as described with reference to FIGS. 25 and 26.

The sacrificial layer and the first device isolation pattern 210a may be planarized until a surface of the preliminary charge storage pattern 262 is exposed.

The preliminary charge storage pattern 262 may be formed to a substantially small thickness of about 20 Å to about 500 Å. The first and second gate patterns 258 and 256 may be formed with a thickness greater than that of the preliminary charge storage pattern 262 on the portion of the cell area and the peripheral area of the substrate 200. The preliminary charge storage pattern 262 may include a conductive material (e.g., polysilicon). The preliminary charge storage pattern 262 may include silicon nitride and a metal oxide.

A dielectric layer (not shown) may be formed on the preliminary charge storage pattern 262, the device isolation patterns 210a and 210b and first and second gate patterns 258 and 256 by the same process as described with reference to FIGS. 30 and 31. The dielectric layer may be partially removed from the peripheral area of the substrate 200 and the first gate pattern 258 by a photolithography process.

An electrode layer (not shown) may be formed on the dielectric layer. The electrode layer, the dielectric layer, the preliminary charge storage pattern 262 and the tunnel oxide layer 260 may be sequentially patterned to form a cell transistor in the cell area of the substrate 200 in which a tunnel oxide pattern 260a, a charge storage pattern 262a, a dielectric pattern 264 and a control gate pattern 266 are sequentially stacked. In the same patterning process, the first gate pattern 258 may be electrically connected to the control gate pattern 266 to form a butting structure on the gate electrode of the selection transistor.

The electrode layer and the dielectric layer on the second gate pattern 256 may be patterned in the above patterning process in the cell area of the substrate 200. A conductive pattern 234 (not shown), which may include the same material as that of the control gate pattern, may be formed on the second gate pattern 256. The gate electrode of the peripheral transistor may have a butting structure.

The dielectric layer and the electrode layer on the second gate pattern may be removed from the peripheral area of the substrate 200. The dielectric layer and the electrode layer on the second gate pattern may remain on the peripheral area of the substrate 200. In such a case, no butting structure may be formed on the gate electrode of the peripheral transistor.

According to example embodiments, a pattern for a semiconductor device may be more uniformly formed with a relatively small thickness on the entire surface of the substrate. The pattern may be used as a charge storage pattern for a non-volatile memory device. If the pattern is used in the non-volatile memory device including a floating gate or a charge trap gate, uniformity and reliability in operation characteristics may increase and/or a higher degree of integration in the non-volatile memory device may be obtained.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of forming a charge storage pattern for a non-volatile memory device, comprising:

forming a trench by partially etching a substrate;

forming a mold pattern on a substrate, wherein forming the mold pattern includes forming a device isolation pattern in the trench such that the device isolation pattern protrudes from a surface of the substrate in order to form an opening exposing the surface of the substrate and forming a tunnel oxide layer on the substrate in the opening;

selectively forming a preliminary pattern on the mold pattern and on the substrate exposed through the mold pattern, wherein selectively forming the preliminary pattern includes forming a preliminary charge storage pattern by selectively depositing a conductive material on the tunnel oxide layer and on the device isolation pattern, and forming a protective layer on the preliminary charge storage pattern and a sidewall of the device isolation pattern;

removing the preliminary pattern from the mold pattern such that the preliminary pattern only remains on the substrate to form the pattern on the substrate, wherein removing the preliminary pattern includes removing the preliminary charge storage pattern from the device isolation pattern such that the preliminary charge storage pattern only remains on the tunnel oxide layer to form the charge storage pattern on the substrate, and wherein prior to removal of the preliminary pattern from the mold pattern, a thickness of the preliminary pattern is less than a protrusion thickness of the mold pattern measured from a surface of the substrate;

forming a sacrificial layer to fill up the opening;

removing the sacrificial layer until the protective layer on the device isolation pattern is exposed;

removing the protective layer and the preliminary charge storage pattern under the protective layer from the device isolation pattern;

removing the sacrificial layer in the opening; and removing the protective layer from the preliminary charge storage pattern at a bottom portion of the opening such that the preliminary charge storage pattern on the tunnel oxide layer is exposed through the opening, after forming the protective layer.

2. The method of claim 1, wherein forming the preliminary charge storage pattern includes performing at one process selected from the group consisting of a PVD process and a CVD process.

3. The method of claim 1, wherein the preliminary charge storage pattern includes at least one material selected from the group consisting of polysilicon doped with impurities, a metal, a metal silicide and compositions thereof.

4. The method of claim 1, wherein the preliminary charge storage pattern includes at least one compound selected from the group consisting of silicon nitride, a metal oxide and combinations thereof.

5. The method of claim 1, wherein the preliminary charge storage pattern is formed with a thickness of about 20 Å to about 500 Å.

6. The method of claim 1, wherein removing the sacrificial layer includes performed at least one process selected from the group consisting of a dry etching process and a CMP process.

7. The method of claim 1, wherein removing the protective layer includes performing a wet etching process.

8. The method of claim 1, wherein a sidewall of the device isolation pattern is slanted such that an upper portion of the opening is smaller than a lower portion of the opening, the device isolation pattern defining the opening through which the substrate is exposed.

9. The method of claim 2, wherein the CVD process includes an HDP-CVD process.

10. The method of claim 8, further comprising removing an upper portion of the device isolation pattern from the substrate, after forming the opening.

* * * * *